US007144805B2

(12) United States Patent
Chen et al.

(10) Patent No.: US 7,144,805 B2
(45) Date of Patent: *Dec. 5, 2006

(54) METHOD OF SUBMICRON METALLIZATION USING ELECTROCHEMICAL DEPOSITION OF RECESSES INCLUDING A FIRST DEPOSITION AT A FIRST CURRENT DENSITY AND A SECOND DEPOSITION AT AN INCREASED CURRENT DENSITY

(75) Inventors: LinLin Chen, Plano, TX (US); Lyndon W. Graham, Hillsboro, OR (US); Thomas L. Ritzdorf, Bigfork, MT (US); Dakin Fulton, Whitefish, MT (US); Robert W. Batz, Jr., Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 95 days.

This patent is subject to a terminal disclaimer.

(21) Appl. No.: 10/882,664

(22) Filed: Jul. 1, 2004

(65) Prior Publication Data
US 2005/0051436 A1    Mar. 10, 2005

Related U.S. Application Data

(63) Continuation of application No. 09/815,931, filed on Mar. 23, 2001, now Pat. No. 6,806,186, which is a continuation of application No. PCT/US99/23187, filed on Oct. 5, 1998, and a continuation-in-part of application No. 09/018,783, filed on Feb. 4, 1998.

(60) Provisional application No. 60/103,061, filed on Oct. 5, 1998.

(51) Int. Cl.
*H01L 21/4763* (2006.01)
*H01L 21/44* (2006.01)

(52) U.S. Cl. ................. 438/644; 438/672; 438/675

(58) Field of Classification Search ................ 438/644, 438/672, 675
See application file for complete search history.

(56) References Cited

U.S. PATENT DOCUMENTS 2,443,599 A    6/1948    Chester (Continued)

FOREIGN PATENT DOCUMENTS

CN    99804128.9    3/1999

(Continued)

OTHER PUBLICATIONS

Ahn, E. C. et al. "Adhesion Reliability of Cu-Cr Alloy Films to Polyimide" Materials Research Society Symposium Proceedings, 1996, vol. 427, pp. 141-145, Materials Research Society.

(Continued)

*Primary Examiner*—William M. Brewster
(74) *Attorney, Agent, or Firm*—Perkins Coie LLP

(57) ABSTRACT

Methods for depositing a metal into a micro-recessed structure in the surface of a microelectronic workpiece are disclosed. The methods are suitable for use in connection with additive free as well as additive containing electroplating solutions. In accordance with one embodiment, the method includes making contact between the surface of the microelectronic workpiece and an electroplating solution in an electroplating cell that includes a cathode formed by the surface of the microelectronic workpiece and an anode disposed in electrical contact with the electroplating solution. Next, an initial film of the metal is deposited into the micro-recessed structure using at least a first electroplating waveform having a first current density. The first current density of the first electroplating waveform is provided to enhance the deposition of the metal at a bottom of the micro-recessed structure. After this initial plating, deposition of the metal is continued using at least a second electroplating waveform having a second current density. The second current density of the second electroplating waveform is provided to assist in reducing the time required to substantially complete filling of the micro-recessed structure.

29 Claims, 8 Drawing Sheets

U.S. PATENT DOCUMENTS

| | | |
|---|---|---|
| 3,267,010 A | 8/1966 | Creutz et al. |
| 3,328,273 A | 6/1967 | Creutz et al. |
| 3,658,663 A | 4/1972 | Fukanuma et al. |
| 3,664,933 A | 5/1972 | Clauss |
| 3,706,635 A | 12/1972 | Kowalski |
| 3,715,289 A | 2/1973 | Cope, Jr. |
| 3,716,462 A | 2/1973 | Jensen |
| 3,727,620 A | 4/1973 | Orr |
| 3,770,598 A | 11/1973 | Creutz |
| 3,862,891 A | 1/1975 | Smith |
| 3,878,066 A | 4/1975 | Dettke et al. |
| 3,894,918 A | 7/1975 | Corby et al. |
| 3,930,963 A | 1/1976 | Polichette et al. |
| 3,990,926 A | 11/1976 | Konicek |
| 4,000,046 A | 12/1976 | Weaver |
| 4,027,686 A | 6/1977 | Shortes et al. |
| 4,030,015 A | 6/1977 | Herko et al. |
| 4,065,374 A | 12/1977 | Asami et al. |
| 4,092,176 A | 5/1978 | Kozei et al. |
| 4,100,054 A | 7/1978 | DuRocher |
| 4,110,176 A | 8/1978 | Creutz et al. |
| 4,113,492 A | 9/1978 | Sato et al. |
| 4,134,802 A | 1/1979 | Herr |
| 4,250,004 A | 2/1981 | Miles |
| 4,272,335 A | 6/1981 | Combs |
| 4,279,948 A | 7/1981 | Kukanskis |
| 4,315,059 A | 2/1982 | Raistrick |
| 4,336,114 A | 6/1982 | Mayer |
| 4,376,685 A | 3/1983 | Watson |
| 4,384,930 A | 5/1983 | Eckles |
| 4,385,978 A | 5/1983 | Prusak |
| 4,401,521 A | 8/1983 | Ohmura |
| 4,405,416 A | 9/1983 | Raistrick |
| 4,428,815 A | 1/1984 | Powell |
| 4,435,266 A | 3/1984 | Johnston |
| 4,443,117 A | 4/1984 | Muramoto |
| 4,475,823 A | 10/1984 | Stone |
| 4,489,740 A | 12/1984 | Rattan |
| 4,510,176 A | 4/1985 | Cuthbert |
| 4,514,265 A | 4/1985 | Rao |
| 4,518,678 A | 5/1985 | Allen |
| 4,519,846 A | 5/1985 | Aigo |
| 4,539,222 A | 9/1985 | Anderson |
| 4,576,689 A | 3/1986 | Makkaev |
| 4,624,749 A | 11/1986 | Black |
| 4,687,552 A | 8/1987 | Early |
| 4,693,805 A | 9/1987 | Quazi |
| 4,732,785 A | 3/1988 | Brewer |
| 4,781,801 A | 11/1988 | Frisby |
| 4,810,333 A | 3/1989 | Gulla |
| 4,869,971 A | 9/1989 | Nee |
| 4,879,007 A | 11/1989 | Wong |
| 4,891,069 A | 1/1990 | Holtzman |
| 4,898,647 A | 2/1990 | Luce |
| 4,951,601 A | 8/1990 | Maydan |
| 4,959,278 A | 9/1990 | Shimauchi |
| 4,979,464 A | 12/1990 | Kunze-Concewitz |
| 4,990,224 A | 2/1991 | Mahmoud |
| 5,000,827 A | 3/1991 | Schuster |
| 5,021,129 A | 6/1991 | Arbach |
| 5,039,381 A | 8/1991 | Mullarkey |
| 5,055,425 A | 10/1991 | Leibovitz |
| 5,084,412 A | 1/1992 | Nakasaki |
| 5,091,339 A | 2/1992 | Carey |
| 5,115,430 A | 5/1992 | Hahne |
| 5,135,636 A | 8/1992 | Yee |
| 5,145,571 A | 9/1992 | Lane |
| 5,151,168 A | 9/1992 | Gilton |
| 5,155,336 A | 10/1992 | Gronet |
| 5,160,600 A | 11/1992 | Patel |
| 5,162,260 A | 11/1992 | Leibovitz |
| 5,164,332 A | 11/1992 | Kumar |
| 5,207,883 A | 5/1993 | Borrione |
| 5,209,817 A | 5/1993 | Ahmad |
| 5,222,310 A | 6/1993 | Thompson |
| 5,224,504 A | 7/1993 | Thompson |
| 5,230,743 A | 7/1993 | Thompson |
| 5,252,807 A | 10/1993 | Chizinsky |
| 5,256,274 A | 10/1993 | Poris |
| 5,259,407 A | 11/1993 | Tuchida |
| 5,277,985 A | 1/1994 | Li |
| 5,284,548 A | 2/1994 | Carey |
| 5,290,361 A | 3/1994 | Hayashida |
| 5,302,464 A | 4/1994 | Nomura |
| 5,306,895 A | 4/1994 | Ushikoshi |
| 5,314,756 A | 5/1994 | Tagaya |
| 5,316,974 A | 5/1994 | Crank |
| 5,328,589 A | 7/1994 | Martin |
| 5,349,978 A | 9/1994 | Sago |
| 5,368,711 A | 11/1994 | Poris |
| 5,372,848 A | 12/1994 | Blackwell |
| 5,377,708 A | 1/1995 | Bergman |
| 5,391,517 A | 2/1995 | Gelatos |
| 5,397,741 A | 3/1995 | O'Connor |
| 5,403,468 A | 4/1995 | Nakakoji |
| 5,409,587 A | 4/1995 | Sandhu |
| 5,411,076 A | 5/1995 | Matsunaga |
| 5,429,733 A | 7/1995 | Ishida |
| 5,431,803 A | 7/1995 | DiFranco |
| 5,441,618 A | 8/1995 | Matsuda |
| 5,443,865 A | 8/1995 | Tisdale |
| 5,447,599 A | 9/1995 | Li |
| 5,472,502 A | 12/1995 | Batchelder |
| 5,482,891 A | 1/1996 | Shieh |
| 5,484,518 A | 1/1996 | Goldberg |
| 5,516,416 A | 5/1996 | Canaperi |
| 5,567,267 A | 10/1996 | Kazama |
| 5,579,052 A | 11/1996 | Artieri |
| 5,584,971 A | 12/1996 | Komino |
| 5,600,532 A | 2/1997 | Michiya |
| 5,605,615 A | 2/1997 | Goolsby |
| 5,608,943 A | 3/1997 | Konishi |
| 5,612,254 A | 3/1997 | Mu |
| 5,625,170 A | 4/1997 | Poris |
| 5,627,102 A | 5/1997 | Shinriki |
| 5,639,316 A | 6/1997 | Cabral |
| 5,650,082 A | 7/1997 | Anderson |
| 5,651,823 A | 7/1997 | Parodi |
| 5,651,865 A | 7/1997 | Sellers |
| 5,660,472 A | 8/1997 | Peuse |
| 5,674,787 A | 10/1997 | Zhao |
| 5,677,244 A | 10/1997 | Venkatraman |
| 5,681,443 A | 10/1997 | Ameen |
| 5,685,970 A | 11/1997 | Ameen |
| 5,693,563 A | 12/1997 | Teong |
| 5,695,810 A | 12/1997 | Dubin |
| 5,705,223 A | 1/1998 | Bunkofske |
| 5,707,466 A | 1/1998 | Atwater |
| 5,718,813 A | 2/1998 | Drummond |
| 5,719,447 A | 2/1998 | Gardner |
| 5,723,028 A | 3/1998 | Poris |
| 5,730,854 A | 3/1998 | Martin |
| 5,747,355 A | 5/1998 | Konuma |
| 5,763,953 A | 6/1998 | IIjima |
| 5,779,799 A | 7/1998 | Davis |
| 5,801,444 A | 9/1998 | Aboelfotoh |
| 5,802,856 A | 9/1998 | Schaper |
| 5,814,557 A | 9/1998 | Venkatraman |
| 5,824,599 A | 10/1998 | Schacham-Diamand |
| 5,873,992 A | 2/1999 | Glezen |
| 5,882,498 A | 3/1999 | Dubin |
| 5,891,513 A | 4/1999 | Dubin |
| 5,892,207 A | 4/1999 | Kawamura |
| 5,893,752 A | 4/1999 | Zhang |

| | | |
|---|---|---|
| 5,897,368 A | 4/1999 | Cole |
| 5,908,543 A | 6/1999 | Matsunami |
| 5,913,147 A | 6/1999 | Dubin |
| 5,932,077 A | 8/1999 | Reynolds |
| 5,937,142 A | 8/1999 | Moslehi |
| 5,939,788 A | 8/1999 | McTeer |
| 5,969,422 A | 10/1999 | Ting |
| 5,972,192 A * | 10/1999 | Dubin et al. ............... 205/101 |
| 5,989,406 A | 11/1999 | Beetz |
| 5,989,623 A | 11/1999 | Chen |
| 6,015,749 A | 1/2000 | Liu |
| 6,017,820 A | 1/2000 | Ting |
| 6,036,836 A | 3/2000 | Peeters |
| 6,037,257 A | 3/2000 | Chiang |
| 6,043,153 A | 3/2000 | Nogami |
| 6,062,424 A | 5/2000 | Simile-Gravina |
| 6,066,892 A | 5/2000 | Ding |
| 6,069,068 A | 5/2000 | Rathore |
| 6,072,160 A | 6/2000 | Bahl |
| 6,072,163 A | 6/2000 | Armstrong |
| 6,073,681 A | 6/2000 | Getchel |
| 6,074,544 A | 6/2000 | Reid |
| 6,086,680 A | 7/2000 | Foster |
| 6,099,712 A | 8/2000 | Ritzdorf |
| 6,100,195 A | 8/2000 | Chan |
| 6,107,192 A | 8/2000 | Subrahmanyan |
| 6,108,937 A | 8/2000 | Raaijmakers |
| 6,113,771 A | 9/2000 | Landau |
| 6,121,141 A | 9/2000 | Woo |
| 6,123,825 A | 9/2000 | Uzoh |
| 6,126,761 A | 10/2000 | DeHaven |
| 6,126,989 A | 10/2000 | Robinson |
| 6,130,415 A | 10/2000 | Knoot |
| 6,136,163 A | 10/2000 | Cheung |
| 6,139,697 A | 10/2000 | Chen |
| 6,139,703 A | 10/2000 | Hanson |
| 6,157,106 A | 12/2000 | Tietz |
| 6,184,121 B1 | 2/2001 | Buchwalter |
| 6,184,137 B1 | 2/2001 | Ding |
| 6,197,181 B1 | 3/2001 | Chen |
| 6,197,688 B1 | 3/2001 | Simpson |
| 6,228,768 B1 | 5/2001 | Woo |
| 6,254,758 B1 | 7/2001 | Koyama |
| 6,277,263 B1 | 8/2001 | Chen |
| 6,278,089 B1 | 8/2001 | Young |
| 6,280,183 B1 | 8/2001 | Mayur |
| 6,290,833 B1 | 9/2001 | Chen |
| 6,297,154 B1 | 10/2001 | Gross |
| 6,309,524 B1 | 10/2001 | Woodruff |
| 6,319,831 B1 | 11/2001 | Tsai |
| 6,471,913 B1 | 10/2002 | Weaver |
| 6,508,920 B1 | 1/2003 | Ritzdorf |
| 2001/0042689 A1 | 11/2001 | Chen |
| 2002/0000271 A1 | 1/2002 | Ritzdorf |
| 2002/0022363 A1 | 2/2002 | Ritzdorf |
| 2002/0043466 A1 | 4/2002 | Dordi |
| 2002/0074233 A1 | 6/2002 | Ritzdorf |
| 2002/0102837 A1 | 8/2002 | Ritzdorf |
| 2003/0045095 A1 | 3/2003 | Ritzdorf |

FOREIGN PATENT DOCUMENTS

| | | |
|---|---|---|
| EA | 99905771.4 | 2/1999 |
| EA | 99912827.5 | 3/1999 |
| EP | 0 751 567 | 1/1997 |
| EP | 0 881 673 | 12/1998 |
| EP | 99954748.2 | 10/1999 |
| EP | 0 964 433 A2 | 12/1999 |
| EP | 0 982 771 | 3/2000 |
| EP | 1 069 213 A2 | 1/2001 |
| GB | 2 285 174 A | 12/1994 |
| JP | 52-16433 | 7/1975 |
| JP | 57073953 | 10/1980 |
| JP | 59-16993 | 7/1982 |
| JP | 58182823 | 10/1983 |
| JP | 60-219741 | 8/1984 |
| JP | 59-136950 | 11/1985 |
| JP | 63118093 | 5/1988 |
| JP | 1008396 | 1/1989 |
| JP | 4131395 | 5/1992 |
| JP | 4280993 | 10/1992 |
| JP | 5-142262 | 6/1993 |
| JP | 6017291 | 1/1994 |
| JP | 2000-536908 | 3/1999 |
| JP | 2000-574753 | 8/2001 |
| KR | 10-2000-7008286 | 3/1999 |
| SG | 9906323-2 | 2/1999 |
| SG | 200004296-0 | 3/1999 |
| TW | 88104516 | 3/1999 |
| TW | 89120978 | 3/1999 |
| WO | WO-91/04213 | 4/1991 |
| WO | WO-97/12079 | 4/1997 |
| WO | WO-98/27585 | 6/1998 |
| WO | WO-99/47731 | 3/1999 |
| WO | WO-99/40615 | 8/1999 |
| WO | WO-99/47545 | 9/1999 |
| WO | WO-00/20662 | 10/1999 |
| WO | WO-00/61837 | 10/2000 |
| WO | WO-01/59815 | 8/2001 |

OTHER PUBLICATIONS

Alers, G. B. et al. "Trade-off between reliability and post-CMP defects during recrystallization anneal for copper damascene interconnects" IEEE International Reliability Physics Symposium, 2001, pp. 350-354.

Ali, Hassano O. et al. "A Review of Electroless Gold Deposition Processes," Gold Bull (1984) pp. 118-127, 17 (4).

Alkire, Richard, "Transient Behavior during Electrodeposition onto a Metal Strip of High Ohmic Resistance," J. Electrochemical Society: Electrochemical Science, Dec. 1971, pp. 1935-1941, vol. 118, No. 12.

Appendix No. 2, Summary of Prior Art References, (4 pgs).

Benedetti, A.V. et al., "Electrochemical Studies of Copper, Copper-Aluminum and Copper-Aluminum-Silver Alloys: Impedance Results 0.5M NaCl," Electrochemica Acta (Mar. 1995) pp. 000, vol. 40, Great Britain.

Bindra, Perminder et al., "Fundamental Aspects of Electroless Copper Plating," Electroless Plating Fundamentals & Applications (Jan. 1990), pp. 289-375, Noyes Data Corporation/Noyes Publications.

Carel, R., Thompson, C.V., Frost, H.J., Material Research Society Symposium, vol. 343, Materials Research Society (1994).

Cook, M. and Richards, T., "The Self-Annealing of Copper," J. Inst. Metals, vol. LXX, pp. 159-179, (1943).

Correction of Request for Ex Parte Reexamination; In Re Reexamination of U.S. Patent No. 6,074,544; Reexamination Control No.: 90/006,689; Jul. 14, 2003 (10 pgs).

Declaration of John Newman, (15 pgs).

DeSilva, Melvin J. et al., "A Novel Seed Layer Scheme to Protect Catalytic Surfaces for Electroless Deposition," J. Electrochem. Soc. (Nov. 1996) pp. 3512-3516, vol. 143, No. 11.

Despic, Aleksandar R., "Deposition and Dissolution of Metals and Alloys, Part B: Mechanisms, Kinetics, Texture, and Morphology," Comprehensive Treatise of Electrochemistry vol. 7: Kinetics and Mechanisms of Electrode Processes (1983) pp. 451-527, Plenum Press, New York and London.

Dubin, V. et al., "Copper Electroplating for On-chip Metallization," 11 pgs, Advanced Micro Devices, Sunnyvale, California.

Dubin, V.M. et al., "Copper Plating Techniques For ULSI Metallization," Advanced Metallization and Interconnect Systems for ULSI Application in 1997: Materials Research Society Symposium Proceedings, (Jan. 1998) pp. 405-411, Materials Research Society, Warrendale.

Dubin, V.M. et al., "Selective and Blanket Electroless Copper Deposition for Ultralarge Scale Integration," J. Electrochem. Soc. (Mar. 1997) pp. 898-908, vol. 144, No. 3, The Electrochemical Society, Inc., Pennington, NJ.

Dubin, V. M., Shacham-Diamand, Y., Zhao, B., Vasudev, P.K. and Ting, C.H., "Sub-Half Micron Electroless Cu Metallization," Materials Research Society Symposium Proceedings, vol. 427, San Francisco, CA (1996).

Edelstein, D. et al., "Full Copper Wiring in a Sub-0.25um CMOS ULSI Technology," IEEE< pp. 773-776, 1997.

Field, D.P., Sanchez, J. Jr., Besser, P.R., Dingley, D.J., "Analysis of Grain-Boundary Structure in AI-Cu Interconnects," J. Appl., Phys., 82(5) (Sep. 1, 1997).

Floro, J.A., Carel, R., and Thompson C.V., "Energy Minimization During Epitaxial Grain Growth Strain vs. Interfacial Energy," Material Research Society Symposium, vol. 317, Materials Research Society (1994).

Foulke, D.G., in "Gold Plating Technology", Reid, F.H. and Goldie, W., p67, Electrochemical Publication Limited, British Isles (1996).

Frost, H.J. and Thompson, C.V., "Microstructural Evolution in Thin Films," presented at the Symposium on Computer Simulation of Microstructural Evolution, Toronto, Canada, Oct. 15, 1985.

Frost, H.J. and Thompson, C.V., "Modeling of Optical Thin Films," reprint from Proceedings of SPIE (International Society for Optical Engineering, San Diego, CA 1987, printed by the Society of Photo-Optical Instrumentation Engineers (1988).

Frost, H.J., Thompson, C.V., and Walton, D.T., "Abnormal Grain Growth in This Films Due to Anisotropy of Free-Surface Energies," Materials Science Forum, vols. 94-96, pp. 543-550, Trans Tech. Publications, Switzerland (1992).

Frost, H.J., Thompson, C.V., and Walton, D.T., "Grain Growth Stagnation and Abnormal Grain Growth in Thin Films," presented at TMS-AIME Fall Meeting, Indianapolis, IN (1989).

Fujinami, T. et al., "Electroless Copper Plating on PZT Ceramic," Plating & Surface Finishing (May 1998) pp. 100-104.

Gabe, D.R., "Principles of Metal Surface Treatment and Protection, " Second Edition (1978), Chapters 1, 2, and 8, 198 pgs, Pergamon Press, Great Britain.

Gangulee, A., "Structure of Electroplated and Vapor-Depositied Copper Films III. Recrystallization and Grain Growth," Setember 1974, vol. 45, No. 9, pp. 3749-3756, J. Appl. Phys.

Gangulee, A., "The Structure of Electroplated and Vapor-Deposited Copper Films," Mar. 1972, vol. 43, No. 3, pp. 867-873, J. Appl. Phys.

Gignac, L.M. et al., "Characterization of Plated Cu Thin Film Microstructures," Material Research Symposium Proceedings vol. 564: Advanced Interconnects and Contacts (Apr. 1999) pp. 373-434, Materials Research Society, Warrendale.

Gladkikh, A. et al. "Activation Energy of Electromigration in Copper Thin Film Conductor Lines" Materials Research Society Symposium Proceedings, 1996, vol. 427, pp. 121-126, Materials Research Society.

Gross, M.E. et al., "Microstructure and Texture of electroplated Copper in Damascene Structures," Material Research Society Proceedings, vol. 514, 1998.

Gupta, D. "Comparative Cu Diffusion Studies in Advanced Metallizations of Cu and AI-Cu Based Thin Films," Materials Research Society Symposium Proceedings, San Francisco, CA (Apr. 1994).

Harper, J.M.E. et al., "Microstructure control in semiconductor metallization," J. Vac Sci Technology 15 (4), pp. 763-779, Jul./Aug. 1997.

Hogan, B.M., "Microstructural Stability of Copper Electroplate," (citation unknown but believed to be published more than one year before the date of this patent application).

Information Disclosure Citation in a Patent; Patent No. 6,074,544; Applicant: Jonathan D. REid; (2 pgs).

Kang, S. et al., "Relationship Between Texture and Surface Morphology of Copper Electrodeposits," Plating & Surface Finishing (Oct. 1995) pp. 67-70.

Kelly, J.J. et al., "Copper Deposition in the Presence of Polyethylene Glycol: I. Quartz Crystal Microbalance Study," J. Electrochem. Soc. (Oct. 1998) pp. 3472-3481, vol. 145, No. 10, The Electrochemical Society, Inc.

Khera, R.P., "The Basic Principles of Electrolytic Deposition," pp. 69-84.

Kononenko, O. V. et al. "Electromigration In Submicron Wide Copper Lines" Materials Research Society Symposium Proceedings, 1996, vol. 427, pp. 127-132, Materials Research Society.

Krishnan, R.M. et al., "Electroplating of Copper from a Non-cyanide Electrolyte," Plating & Surface Finishing (Jul. 1995) pp. 56-59, vol. 82, No. 7.

Kröger, R. et al., "Properties of Copper Films Prepared by Chemical Vapor Deposition for Advanced Metallization of Microelectronic Devices," Journal of the Electrochemical Society (1999) pp. 3248-3254, vol. 146, No. 9.

L'Augmentation Du Courant Limite Par Les Differentes Formes D'Electrodes, 20 pgs.

Lanzi, Oscar et al. "Terminal Effect at a Resistive Electrode under Tafel Kinetics," J. Electrochemical Society, Apr. 1990, pp. 1139-1143, vol. 137, No. 4.

Lopatin, S. et al., "Conformal Electroless Copper Deposition For Sub—0.5 βm Interconnect Wiring of Very High Aspect Radio," Proceedings of the Third Symposium on Electrochemically Deposited Thin Films (1997) pp. 271-288, vol. 96-19, The Electrochemical Society, Inc., Pennington.

Lopatin, S. et al., "Electroless Cu and Barrier Layers for Sub-Half Micron Multilevel Interconnects," Multilevel Interconnect Technology, Conference 3214, SPIE (Oct. 1997) pp. 21-32, vol. 3214.

Lopatin, S. et al., "Extendibility of Ion-Metal Plasma and Electroplating Technologies for Damascene-Based Copper Metallization," 7 pgs, Advanced Micro Devices, Sunnyvale.

Lowenheim, F.A. et al. (Eds.), "Gold" Modern Electroplating, Third Edition (1974) pp. 224-244, John Wiley * Sons, Inc., New York.

Lowenheim, Frederick, "Electroplating," pp. 416-425, Jan. 1979.

Mak, C.Y., "Electroless Copper Deposition on Metals and Metal Silicides," Materials Research Society Bulletin, (Aug. 1994).

Matlosz, M. et al. "Nonuniform Current Distribution and Thickness during Electrodeposition onto Resistive Substrates," J. Electrochemical Society, Mar. 1992, pp. 752-761, vol. 139, No. 3.

Megaw, H.D. and Stokes, A.R., "Breadths of X-Ray Diffraction Lines and Mechanical Properties of Some Cold-Worked Metals," J Inst. Metals, vol. LXXI, pp. 279-289 (1944).

Mel, Y. et al. "Thermal Stability and Interaction Between SIOF and Cu Film" Materials Research Society Symposium Proceedings, 1996, vol. 427, pp. 433-439, Materials Research Society.

Murarka, S.P. "Metallization: Theory and Practice for VLSI and ULSI," 256 pgs (1993) Reed Publishing (USA).

Murarka, S.P. et al., "Copper Metallization for ULSI and Beyond," Critical Reviews in Solid State and Materials Sciences (1995) pp. 87-124, vol. 20, No. 2.

Newman, John, "Anaylsis and Stimulation of Electrochemical Systems," http://www.cchem.berkeley,edu/~jsngrp/newman_cv.html, accessed Jan. 12, 2004.

Nguyen, et al. "Interconnect and Contact Metallization". Eds. H.S. Rathore, G.S. Mathan, C. Plougonven and C.C. Schuckert, PV 97-31, The Electrochemical Society, Inc., Pennington, NJ.

Nobe, K., "Electrodissolution Kinetics of Metals and Alloys," (date?) 17 pgs, Department of Chemical Engineering, University of California, Los Angeles.

Notice of Assignment of Reexamination Request; Reexamination Control No. 90/006,689; Patent No. 6,074,544; Jul. 30, 2003.

Notice of Reexamination Request Filing Date; Reexamination Control No. 90/006,689; Patent No. 6,074,544; Jul. 30, 2003.

Office Action mailed Apr. 4, 2003 for U.S. Appl. No. 09/880,715; First Named Inventor: Thomas L. Ritzdorf (14 pgs).

Order Regarding the Court's Construction of Disputed Claim Term in Novellus' U.S. Patent No. 6,074,544 (4 pgs).

Oskam, G. et al., "Electrochemical Deposition of Copper on a n-Si/Tin," Journal of The Electrochemical Society (1999) pp. 1436-1441, vol. 146, No. 4.

Palmans R., et al., "Development of An Electroless Copper Deposition Bath For Via Fill Applications on Tin Seed Layers," Advanced Metallization for ULSI Applications in 1994: Materials Research Society Symposium Proceedings, (Jan. 1995) pp. 87-94 Materials Research Society, Pittsburgh.

Patent Abstracts of Japan 04-120290, Apr. 21, 1992.

Patent Owner's Statement Under 37 CFR § 1.530, (11 pgs).
Pitney, Kenneth E., "NEY Contact Manual," Electrical Contacts for Low Energy Uses, 1973.
Plotner, M., Urbansky, N., Preusz, A. and Wenzel, C., "Control of Mechanical Stresses and their Temperature Dependence in PVD CU Films," presented at Adv. Metalliz. & Interconn. Syst. ULSI Applic. San Diego (1997).
Preliminary Amendment with Patent Owner's Statement; (15 pgs).
Reed-Hall, et. al., "Physical Metallurgy Principles," pp. 270, 286 and 287, 83rd Ed. (1991).
Reexamination Communication Transmittal Form; Patent No. 6,074,544; Reexamination Control No. 90/006,689; Sep. 15, 2003 (6 pgs).
Reid, J.D. et al., "Impedance Behavior of a Sulfuric Acid-Cupric Sulfate/Copper Cathode Interface," J. Electrochem Society: Electrochemical Science and Technology (Jun. 1987) pp. 1389-1394, vol. 134, No. 6.
Reply to Patent Owner's Statement Under 37 CFR § 1.535, ( 21 pgs).
Request for Ex Parte Reexamination; Patent No. 6,075,544; Jul. 1, 2003 (12 pgs).
Ritzdorf, T. Graham, L., Jin, S., Mu, C. and Fraser, D., "Self-Annealing of Eletrochemically Deposited Copper Films in Advanced Interconnect Applications," Proceedings of the IEEE 1998 International Interconnect Technology Conference, San Francisco, CA (Jun. 1-3, 1998).
Russell, S. W. et al. "The Effect of Copper on the Titanium-Silicon Dioxide Reaction and the Implications for Self-Encapsulating, Self-Adhering Metallization Lines", Materials Research Society Symposium Proceedings, 1992, vol. 260, pp. 763-768, Materials Research Society, Pittsburgh, PA.
Ryan, J.G. et al., "Technology Challenges for Advanced Interconnects," Date Unknown.
Sanchez, J. Jr. and Besser, P.R., "Modeling Microstructure Development in Trench-interconnect Structures," submitted to International Interconncet Technology Conference, Sunnyvale, CA. (Jun. 1998).
Sanchez, J. Jr., Besser, P.R., and Field, D.P., "Microstructure of Damascene Processed Al-Cu Interconnects for Integrated Circuit Applications," presented at the Fourth International Workshop on Stress Induced Phenomena in Metallizations, Tokyo, Japan (Jun. 1997).
Sato, N., "Toward a More Fundamental Understanding of Corrosion Processes," Corrosion (May 1989) pp. 354-367, vol. 45, No. 5.
Schlesinger, M. et al. (Eds.), "Electrodeposition of Gold," Modern Electroplating, Fourth Edition (2000) pp. 201-225, John Wiley & Sons, Inc. (USA).
Schlesinger, M. et al., "Electroless Deposition of Nickel," Modern Electroplating, Fourth Edition (2000) pp. 667-684 John Wiley & Sons, Inc. (USA).
Shacham-Diamand, Y. et al., "0.35 μm Cu-Filled Via Holes By Blanket Deposited Electroless Copper on Sputtered Seed Layer," 3 pgs, SEMATECH, Austin.
Shacham-Diamand, Y. et al., "Electroless Copper Deposition for ULSI," Thin Solid Films 262 (1995) pp. 93-103.
Shacham-Diamand, Y., "Electroless Copper for Micropackaging and Ultralarge-Scale Integrated Circuit Application," Materials for Electronic Packaging (1995) pp. 221-240, Butterworth-Heinemann, Newtown.
Singer, Petr, "Nonuniformity of Copper Electroplating Studied," Semiconductor International, ###Jun. 1, 1998, 2 pgs###.
Singer, Peter, "Tantalum, Copper and Damascence: The Future of Interconnects," Semiconductor International, Jun. 1, 1998, 8 pages.
Smy, T. et al., "Simulation of Electroless Deposition of Cu Thin Films for Very Large Scale Integration Metallization," Journal of The Electrochemical Society (Jun. 1997), pp. 2115-2122, vol. 144, No. 6, The Electrochemical Society, Inc.
Steigerwald, J.M. et al., "Electrochemical Potential Measurements during the Chemical-Mechanical Polsihing of Copper Thin Films," Journal of the Electrochemical Society (Jul. 1995) pp. 2379-2385, vol. 142, No. 7, The Electrochemical Society, Inc.

Stein, B., "A Practical Guide to Understanding, Measuring and Controlling Stress in Electroformed Metals," presented at the AESF Ellectroforming Symposium, Las Vegas, NV (Mar. 1996).
Stoychev, D., Vitanova., I., Vieweger, U., "Influence of the Inclusions in Thick Copper Coatings on Their Physico—Mechanical Properties," (citation unknown but believed to be published more than one year before the date of this patent application).
Stoychev, D.S. et al., "Recovery and recrystallization of Electrodeposited Bright Copper Coatings At Room remperature. I Microhardness in relation to Coating Structure," Journal of Applied Electrochemistry, 15,k 879-886. Chapman and Hall Ltd. (1985).
Stoychev, D.S., and Aroyo, M.S., "On the Influence of Pulse Frequrency upon the Hardness of Bright Copper Electrodeposits." (citation unknow but believed ot be published more than one year before the date of this patent application).
Stoychev, D.S., and Aroyo, M.S., "The Influence of Pulse Frequency on the Hardness of Bright Copper Electrodeposits," Plating & Surface Finishing, pp. 26-28 (date unknown but believed to be published more than one year before the date of this patent application).
Supplementary Search Report from Europen Patent Application No. EP 99 95 4748; Applicant: Semitool, Inc.; Apr. 1, 2003; 2 pgs.
Taylor, T. et al., "Electrolyte Composition Monitoring For Copper Interconnect Applications," Presented at 193rd Meeting of the Electrochemical Society, 26 pgs, Semitool, Inc. Kalispell.
Thompson, C.V. and Knowlton, B.D., "Designing Circuits and Processes to Optimize Performance and Reliability Metallurgy Meets Tead," Microelectronics and Reliability, 36, p. 1683 (1996).
Thompson, C.V., "Observations of Grain Growth in Thin Films," from Microstructural Science for Thin Film Metalizations in Electronics Applications, eds. J. Sanchez, D.A. Smith and N. DeLanerolle, The Minerals, Metals & Materials Society (1988).
Thompson, C.V., and Smith, H.I., "Secondary Grain Growth in Thin Films." Material Research Society Symposium Proc., vol. 57, Materials Research Society (1987).
Tobias, Charles, W., "Theory of the Effect of Electrode Resistance on Current Density Distribution in Electrolytic Cells," Journal of the Electrochemical Society, Oct. 1953, pp. 459-167.
Tomov, V., Stoychev, D.S., Vitanova, I.B., "Recovery And Recrystallization of Electrodeposited Bright Copper Coatings At Room Temperature. II. X-Ray Investigation Of Primary Recrystallization,", Journal of Applied Electrochemisty, 15, 887-894. Champman and Hall Ltd. (1985).
Trandmittal of Correction of Request for Ex Parte Reexamination; In Re Reexamination of U.S. Patent No. 6,074,544; Reexamination Control No. 90/006,689; Jul. 14, 2003 (2 pgs).
Transmittal of Request for Ex Parte Reexamination; Patent No. 6,075,544; Jul. 1, 2003; (2 pgs).
U.S. Patent No. 6,074,544 Invalidity Claim Chart, (27 pgs).
Walton, D.T., Frost, H.J. and Thompson, C.V., "Computer Simulation of Grain Growth in Thin-Film Interconnect Lines," Mat. Res. Soc. Symp. Proc., vol. 225 (1991).
Wolf, Stanley, "Low-k Dielectrics," Silicon Processing for the VLSI Era, vol. 4: Deep Submicron Process Thechnology, 2002, pp. 639-670, vol. 4, Lattice Press, Sunset Beach.
Wong, C.C., Smith, H.I., and Thompson, C.V., Room Temperature Grain Growth in Thin Au Films, from Grain Boundary Structure and Related Phenomena, supplement to Transactions of Japanese Institute of Metals, 27, p. 641 (1986).
Wong, Chee C., Smith, H.I., and Thompson, C.V., "Secondary Grain Growth and Graphoepitaxy in Thin Au Films on Submicrometer-Period Gratings," Material Research Society Symposium Proc, vol. 47, Materials Research Society (1985).
Wünsche, M. et al., "Morphology and Stability of Electrochemically Generated Copper Layers: The Effect of Electron Transfer and Nucleation Kinetics," Circuit World (1996) pp. 4-9, vol. 22, No. 3.
Yoshiki, H. et al., "Adhesion Mechanism of Electroless Copper Film Formed on Ceramic Substrates Using ZnO Thin Film as an Intermediate Layer," J. Electrochem. Soc. (May 1998) pp. 1430-1434, vol. 145, No. 5, The Electrochemical Society, Inc.

Yung, Edward K. et al., "Fundamental Study of Acid Copper Through-Hole Electroplating Process," J. Electrochem. Soc. (Mar. 1989) pp. 756-767, vol. 136, No. 3, The Electrochemical Society, Inc.

Yung, Edward K. et al., "Plating of Copper into Through-Holes and Vias," J. Electrochem. So. (Jan. 1989) pp. 206-215, vol. 136, No. 1, The Electrochemical Society, Inc.

Ahn, E. C. et al. "Adhesion Reliability of Cu-Cr Alloy Films to Polyimide" Materials Research Society Symposium Proceedings, 1996, vol. 427, pp. 141-145, Materials Research Society.

Alers, G. B. et al. "Trade-off between reliability and post-CMP defects during recrystallization anneal for copper damascene interconnects" IEEE International Reliability Physics Symposium, 2001, pp. 350-354.

Ali, Hassan O. et al. "A Review of Electroless Gold Deposition Processes," Gold Bull (1984) pp. 118-127, 17 (4).

Alkire, Richard, "Transient Behavior during Electrodeposition onto a Metal Strip of High Ohmic Resistance," J. Electrochemical Society: Electrochemical Science, Dec. 1971, pp. 1935-1941, vol. 118, No. 12.

Appendix No. 2, Summary of Prior Art References, (4 pgs).

Benedetti, A.V. et al., "Electrochemical Studies of Copper, Copper-Aluminum and Copper-Aluminum-Silver Alloys: Impedance Results in 0.5M NaCl," Electrochimica Acta (Mar. 1995) pp. 000, vol. 40, Great Britain.

Bindra, Perminder et al., "Fundamental Aspects of Electroless Copper Plating," Electroless Plating Fundamentals & Applications (Jan. 1990) pp. 289-375, Noyes Data Corporation/Noyes Publications.

Carel, R., Thompson, C.V., Frost, H.J., Material Research Society Symposium, vol. 343, Materials Research Society (1994).

Cook, M. and Richards, T., "The Self-Annealing of Copper," J. Inst. Metals, vol. LXX, pp. 159-173, (1943).

Correction of Request for Ex Parte Reexamination; In Re Reexamination of U.S. Patent No. 6,074,544; Reexamination Control No. 90/006,689; Jul. 14, 2003 (10 pgs).

Declaration of John Newman, (15 pgs); Date Unknown.

Desilva, Melvin J. et al., "A Novel Seed Layer Scheme to Protect Catalytic Surfaces for Electroless Deposition," J. Electrochem. Soc. (Nov. 1996) pp. 3512-3516, vol. 143, No. 11.

Despic, Aleksandar R., "Deposition and Dissolution of Metals and Alloys, Part B: Mechanisms, Kinetics, Texture, and Morphology," Comprehensive Treatise of Electrochemistry vol. 7: Kinetics and Mechanisms of Electrode Processes (1983) pp. 451-527, Plenum Press, New York and London.

Dubin, V. et al., "Copper Electroplating for On-chip Metallization," 11 pgs, Advanced Micro Devices, Sunnyvale, California; Date Unknown.

Dubin, V.M. et al., "Copper Plating Techniques For ULSI Metallization," Advanced Metallization and Interconnect Systems for ULSI Application in 1997: Materials Research Society Symposium Proceedings, (Jan. 1998) pp. 405-411, Materials Research Society, Warrendale.

Dubin, V.M. et al., "Selective and Blanket Electroless Copper Deposition for Ultralarge Scale Integration," J. Electrochem. Soc. (Mar. 1997) pp. 898-908, vol. 144, No. 3, The Electrochemical Society, Inc., Pennington, NJ.

Dubin, V.M., Shacham-Diamand, Y., Zhao, B., Vasudev, P.K. and Ting, C.H., "Sub-Half Micron Electroless Cu Metallization," Materials Research Society Symposium Proceedings, vol. 427, San Francisco, CA (1996).

Edelstein, D. et al., "Full Copper Wiring in a Sub-0.25um CMOS ULSI Technology," IEEE< pp. 773-776, 1997.

Field, D.P., Sanchez, J. Jr., Besser, P.R., Dingley, D.J., "Analysis of Grain-Boundary Structure in Al-Cu Interconnects," J. Appl., Phys., 82(5) Sep. 1, 1997).

Floro, J.A., Carel, R., and Thompson C.V., "Energy Minimization During Epitaxial Grain Growth Strain vs. Interfacial Energy," Material Research Society Symposium, vol. 317, Materials Research Society (1994).

Foulke, D.G., in "Gold Plating Technology", Reid, F.H. and Goldie, W., p. 67, Electrochemical Publication Limited, British Isles (1996).

Frost, H.J. and Thompson, C.V., "Microstructual Evolution in Thin Films," presented at the Symposium on Computer Simulation of Microstructural Evolution, Toronto, Canada, Oct. 15, 1985.

Frost, H.J. and Thompson, C.V., "Modeling of Optical Thin Films," reprint from Proceedings of SPIE (International Society for Optical Engineering, San Diego, CA 1987, printed by the Society of Photo-Optical Instrumentation Engineers (1988).

Frost, H.J., Thompson, C.V., and Walton, D.T., "Abnormal Grain Growth in This Films Due to Anisotropy of Free-Surface Energies," Materials Science Forum, vols. 94-96, pp. 543-550, Trans Tech. Publications, Switzerland (1992).

Frost, H.J., Thompson, C.V., and Walton, D.T., "Grain Growth Stagnation and Abnormal Grain Growth in Thin Films," presented at TMS-AIME Fall Meeting, Indianapolis, IN (1989).

Fujinami, T. et al., "Electroless Copper Plating on PZT Ceramic," Plating & Surface Finishing (May 1998) pp. 100-104.

Gabe, D.R., "Principles of Metal Surface Treatment and Protection," Second Edition (1978), Chapter 1, 2, and 8, 198 pgs, Pergamon Press, Great Britain.

Gangulee, A., "Structure of Electroplated and Vapor-Deposited Copper Films III. Recrystallization and Grain Growth," Sep. 1974, vol. 45, No. 9, pp. 3749-3756, J. Appl. Phys.

Gangulee, A., "The Structure of Electroplated and Vapor-Deposited Copper Films," Mar. 1972, vol. 43, No. 3, pp. 867-873, J. Appl. Phys.

Gignac, L.M. et al., "Characterization of Plated Cu Thin Film Microstructures," Material Research Society Symposium Proceedings vol. 564: Advanced Interconnects and Contacts (Apr. 1999) pp. 373-434, Materials Research Society, Warrendale.

Gladkikh, A. et al. "Activation Energy of electromigration in Copper Thin Film Conductor Lines" Materials Research Society Symposium Proceedings, 1996, vol. 427, pp. 121-126, Materials Research Society.

Gross, M.E. et al., "Microstructure and Texture of electroplated Copper in Damascene Structures," Material Research Society Proceedings, vol. 514, 1998.

Gupta, D. "Comparative Cu Diffusion Studies in Advanced Metallizations of Cu and Al-Cu Based Thin Films," Materials Research Society Symposium Proceedings, San Francisco, CA (Apr. 1994).

Harper, J.M.E. et al., "Microstructure control in semiconductor metallization," J. Vac Sci Technology 15 (4), pp. 763-779, Jul./Aug. 1997.

Hogan, B.M., "Microstructural Stability of Copper Electroplate," (Date Unknown but believed to be published more than one year before the date of this patent application).

Information Disclosure Citation in a Patent; Patent No. 6,074,544; Applicant: Jonathan D. Reid; (2 pgs); Date Unknown.

Kang, S. et al., "Relationship Between Texture and Surface Morphology of Copper Electrodeposits," Plating & Surface Finishing (Oct. 1995) pp. 67-70.

Kelly, J.J. et al., "Copper Deposition in the Presence of Polythylene Glycol: I. Quartz Crystal Microbalance Study," J. Electrochem. Soc. (Oct. 1998) pp. 3472-3481, vol. 145, No. 10, The Electrochemical Society, Inc.

Khera, R.P., "The Basic Principles of Electrolytic Deposition," pp. 69-84; Date Unknown.

Kononenko, O. V. et al. "Electromigration In Submicron Wide Copper Lines" Materials Research Society Symposium Proceedings, 1996, vol. 427, pp. 127-132, Materials Research Society.

Krishnan, R.M. et al., "Electroplating of Copper from a Non-cyanide Electrolyte," Plating & Surface Finishing (Jul. 1995) pp. 56-59, vol. 82, No. 7.

Kröger, R. et al., "Properties of Copper Films Prepared by Chemical Vapor Deposition for Advanced Metallization of Microelectronic Devices," Journal of the Electrochemical Society (1999) pp. 3248-3254, vol. 146, No. 9.

L'Augmentation Du Courant Limite Par Les Differentes Formes D'Electrodes, 20 pgs, date unknown.

Lanzi, Oscar et al. "Terminal Effect at a Resistive Electrode under Tafel Kinetics," J. Electrochemical Society, Apr. 1990, pp. 1139-1143, vol. 137, No. 4.

Lopatin, S. et al., "Conformal Electroless Copper Deposition For Sub—0.5 µm Interconnect Wiring of Very High Aspect Ratio,"

Proceedings of the Third Symposium on Electrochemically Deposited Thin Films (1997) pp. 271-288, vol. 96-19, The Electrochemical Society, Inc., Pennington.

Lopatin, S. et al., "Electroless Cu and Barrier Layers for Sub-Half Micron Multilevel Interconnects," Multilevel Interconnect Technology, Conference 3214, SPIE (Oct. 1997) pp. 21-32, vol. 3214.

Lopatin, S. et al., "Extendibility of Ion-Metal Plasma and Electroplating Technologies for Damascene-Based Copper Metallization," 7 pgs, Advanced Micro Devices, Sunnyvale.

Lowenheim, Frederick, "Electroplating," pp. 416-425, Jan. 1979.

Mak, C.Y., "Electroless Copper Deposition on Metals and Metal Silicides," Materials Research Society Bulletin, (Aug. 1994).

Matlosz, M. et al. "Nonuniform Current Distribution and Thickness during Electrodeposition onto Resistive Substrates," J. Electrochemical Society, Mar. 1992, pp. 752-761, vol. 139, No. 3.

Megaw, H.D. and Stokes, A.R., "Breadths of X-Ray Diffraction Lines and Mechaninical Properties of Some Cold-Worked Metals," J Inst. Metals, vol. LXXI, pp. 279-289 (1944).

Mel, Y. et al. "Thermal Stability and Interaction Between SIOF and Cu Film" Materials Research Society Symposium Proceedings, 1996, vol. 427, pp. 433-439, Materials Research Society.

Murarka, S.P. "Metallization: Theory and Practice for VLSI and ULSI," 256 pgs (1993) Reed Publishing (USA).

Murarka, S.P. et al., "Copper Metallization for ULSI and Beyond," Critical Reviews in Solid State and Materials Sciences (1995) pp. 87-124, vol. 20, No. 2.

Newman, John, "Anaylsis and Stimulation of Electrochemical Systems," http://www.cchem.berkeley,edu/~jsngrp/newman_cv.html, accessed Jan. 12, 2004.

Nguyen, et al. "Interconnect and Contact Metallization". Eds. H.S. Rathore, G.S. Mathan, C. Plougonven and C.C. Schuckert, PV 97-31, The Electrochemical Society, Inc., Pennington, NJ; Date Unknown.

Nobe, K., "Electrodissolution Kinetics of Metals and Alloys," (date?) 17 pgs, Department of Chemical Engineering, University of California, Los Angeles; Date Unknown.

Office Action mailed Apr. 4, 2003 for Application No. 09/880,715; First Named Inventor: Thomas L. Ritzdorf (14 pgs).

Patent Owner's Statement Under CFR § 1.530, (11 pgs); Jul. 1, 2003.

Preliminary Amendment with Patent Owner's Statement; (15 pgs); Jul. 1, 2003.

Reid, J.D. et al., "Impedance Behavior of a Sulfuric Acid-Cupric Sulfate/Copper Cathode Interface," J. Electrochem Society: Electrochemical Science and Technology (Jun. 1987) pp. 1389-1394, vol. 134, No. 6.

Reply to Patent Owner's Statement Under CFR § 1.535, ( 21 pgs); Date Unknown.

Russell, S. W. et al. "The Effect of Copper on the Titanium-Silicon Dioxide Reaction and the Implications for Self-Encapsulating, Self-Adhering Metallization Lines", Materials Research Society Symposium Proceedings, 1992, vol. 260, pp. 763-768, Materials Research Society, Pittsburgh, PA.

Ryan, J.G. et al., "Technology Challenges for Advanced Interconnects," Date Unknown.

Sanchez, J. Jr. and Besser, P.R., "Modeling Microstructure Development in Trench-interconnect Structures," submitted to International Interconnect Technology Conference, Sunnyvale, CA. (Jun. 1998).

Sanchez, J. Jr., Besser, P.R., and Field, D.P., "Microstructure of Damascene Processed Al-Cu Interconnects for Integrated Circuit Applications," presented at the Fourth International Workshop on Stress Induced Phenomena in Metallizations, Tokyo, Japan (Jun. 1997).

Sato, N., "Toward a More Fundamental Understanding of Corrosion Processes," Corrosion (May 1989) pp. 354-367, vol. 45, No. 5.

Schlesinger, M. et al. (Eds.), "Electrodeposition of Gold," Modern Electroplating, Fourth Edition (2000) pp. 201-225, John Wiley & Sons, Inc. (USA).

Schlesinger, M. et al., "Electroless Deposition of Nickel," Modern Electroplating, Fourth Edition (2000) pp. 667-684 John Wiley & Sons, Inc. (USA).

Shacham-Diamand, Y. et al., "0.35 μm Cu-Filled Via Holes By Blanket Deposited Electroless Copper on Sputtered Seed Layer," 3 pgs, SEMATECH, Austin; Date Unknown.

Shacham-Diamand, Y. et al., "Electroless Copper Deposition for ULSI," Thin Solid Films 262 (1995) pp. 93-103.

Shacham-Diamand, Y., "Electroless Copper for Micropackaging and Ultralarge-Scale Integrated Circuit Applications," Material for Electronic Packaging (1995) pp. 221-240, Butterworth-Heinemann, Newton.

Singer, Peter, "Nonuniformity of Copper Electroplating Studied," Semiconductor International; Jun. 1, 1998, 2 pgs.

Singer, Peter, "Tantalum, Copper and Damascene: The Future of Interconnects," Semiconductor International, Jun. 1, 1998, 8 pages.

Smy, T. et al., "Simulation of Electroless Deposition of Cu Thin Films for Very Large Scale Integration Metallization," Journal of The Electrochemical Society (Jun. 1997), pp. 2115-2122, vol. 144, No. 6, The Electrochemical Society, Inc.

Steigerwald, J.M. et al., "Electrochemical Potential Measurements during the Chemical-Mechanical Polishing of Copper Thin Films," Journal of the Electrochemical Society (Jul. 1995) pp. 2379-2385, vol. 142, No. 7, The Electrochemical Society, Inc.

Stein, B., "A Practical Guide to Understanding, Measuring and Controlling Stress in Electroformed Metals," presented at the AESF Electroforming Symposium, Las Vegas, NY (Mar. 1996).

Stoychev, D., Vitanova, I., Vieweger, U., "Influence of the Inclusions in Thick Copper Coatings on Their Physico—Mechanical Properties," (citation unknown but believed to be published more than one year before the date of this patent application).

Stoychev, D.S. et al., "Recovery and recrystallization of Electrodeposited Bright Copper Coatings At Room remperature. I Microhardness in relation to Coating Structure," Journal of Applied Electrochemistry, 15,k 879-886. Chapman and Hall Ltd. (1985).

Stoychev, D.S., and Aroyo, M.S., "On the Influence of Pulse Frequency upon the Hardness of Bright Copper Electrodeposits." (Date Unknown but believed to be published more than one year before the date of this patent application).

Stoychev, D.S., and Aroyo, M.S., "The Influence of Pulse Frequency on the Hardness of Bright Copper Electrodeposits," Plating & Surface Finishing, pp. 26-28 (date unknown but believed to be published more than one year before the date of this patent application).

Supplementary Search Report from European Patent Application No. EP 99 95 4748; Applicant: Semitool, Inc.; Apr. 1, 2003; 2 pgs.

Taylor, T. et al., "Electrolyte Composition Monitoring For Copper Interconnect Applications," Presented at 193rd Meeting of the Electrochemical Society, 26 pgs, Semitool, Inc. Kalispell.

Thompson, C.V. and Knowlton, B.D., "Designing Circuits and Processes to Optimize Performance and Reliability Metallurgy Meets Tead," Microelectronics and Reliability, 36, p. 1683 (1996).

Thompson, C.V., "Observations of Grain Growth in Thin Films," from Microstructural Science for Thin Film Metalizations in Electronics Applications, eds. J. Sanchez, D.A. Smith and N. DeLanerolle, The Minerals, Metals & Materials Society (1988).

Thompson, C.V., and Smith, H.I., "Secondary Grain Growth in Thin Films." Material Research Society Symposium Proc., vol. 57, Materials Research Society (1987).

Tobias, Charles, W., "Theory of the Effect of Electrode Resistance on Current Density Distribution in Electrolytic Cells," Journal of the Electrochemical Society, Oct. 1953, pp. 459-167.

Tomov, V., Stoychev, D.S., Vitanova, I.B., "Recovery And Recrystallization of Electrodeposited Bright Copper Coatings At Room Temperature. II. X-Ray Investigation Of Primary Recrystallization,", Journal of Applied Electrochemistry, 15, 887-894. Champman and Hall Ltd. (1985).

Transmittal of Correction of Request for Ex Parte Reexamination; In Re Reexamination of U.S. Patent No. 6,074,544; Reexamination Control No. 90/006,689; Jul. 14, 2003 (2 pgs).

Transmittal of Request for Ex Parte Reexamination; Patent No. 6,075,544; Jul. 1, 2003; (2 pgs).

U.S. Patent No. 6,074,544 Invalidity Claim Chart, (27 pgs); Date Unknown.

Walton, D.T., Frost, H.J. and Thompson, C.V., "Computer Simulation of Grain Growth in Thin-Film Interconnect Lines," Mat. Res. Soc. Symp. Proc., vol. 225 (1991).

Wolf, Stanley, "Low-k Dielectrics," Silicon Processing for the VLSI Era, vol. 4: Deep Submicron Process Thechnology, 2002, pp. 639-670, vol. 4, Lattice Press, Sunset Beach.

Wong, C.C., Smith, H.I., and Thompson, C.V., Room Temperature Grain Growth In Thin Au Films, from Grain Boundary Structure and Related Phenomena, supplement to Transactions of Japanese Institute of Metals, 27, p. 641 (1986).

* cited by examiner

US 7,144,805 B2

METHOD OF SUBMICRON METALLIZATION USING ELECTROCHEMICAL DEPOSITION OF RECESSES INCLUDING A FIRST DEPOSITION AT A FIRST CURRENT DENSITY AND A SECOND DEPOSITION AT AN INCREASED CURRENT DENSITY

CROSS-REFERENCE TO RELATED APPLICATIONS

This application is a continuation of U.S. application Ser. No. 09/815,931, filed Mar. 23, 2001 now U.S. Pat. No. 6,806,186 which is a continuation of International PCT Application No. PCT/US99/23187, filed Oct. 5, 1999, which claims the benefit of U.S. Provisional Patent Application No. 60/103,061, filed Oct. 5, 1998, and is also a continuation-in-part of U.S. patent application Ser. No. 09/018,783, filed Feb. 4, 1998.

STATEMENT REGARDING FEDERALLY SPONSORED RESEARCH OR DEVELOPMENT

Not Applicable

BACKGROUND OF THE INVENTION

An integrated circuit is an interconnected ensemble of devices formed within a semiconductor material and within a dielectric material that overlies a surface of the semiconductor material. Devices which may be formed within the semiconductor material include MOS transistors, bipolar transistors, diodes and diffused resistors. Devices which may be formed within the dielectric include thin-film resistors and capacitors. Typically, more than 100 integrated circuit die (IC chips) are constructed on a single 8 inch diameter silicon wafer. The devices utilized in each dice are interconnected by conductor paths formed within the dielectric. Typically, two or more levels of conductor paths, with successive levels separated by a dielectric layer, are employed as interconnections. In current practice, an aluminum alloy and silicon oxide are typically used for, respectively, the conductor and dielectric.

Delays in propagation of electrical signals between devices on a single dice limit the performance of integrated circuits. More particularly, these delays limit the speed at which an integrated circuit may process these electrical signals. Larger propagation delays reduce the speed at which the integrated circuit may process the electrical signals, while smaller propagation delays increase this speed. Accordingly, integrated circuit manufacturers seek ways in which to reduce the propagation delays.

For each interconnect path, signal propagation delay may be characterized by a time delay $\tau$. See E. H. Stevens, *Interconnect Technology*, QMC, Inc., July 1993. An approximate expression for the time delay, $\tau$, as it relates to the transmission of a signal between transistors on an integrated circuit is given by the equation:

$$\tau = RC[1 + (V_{SAT}/RI_{SAT})]$$

In this equation, R and C are, respectively, an equivalent resistance and capacitance for the interconnect path, and $I_{SAT}$ and $V_{SAT}$ are, respectively, the saturation (maximum) current and the drain-to-source potential at the onset of current saturation for the transistor that applies a signal to the interconnect path. The path resistance is proportional to the resistivity, $\rho$, of the conductor material. The path capacitance is proportional to the relative dielectric permittivity, $K_e$, of the dielectric material. A small value of $\tau$ requires that the interconnect line carry a current density sufficiently large to make the ratio $V_{SAT}/RI_{SAT}$ small. It follows, therefore, that a low-$\rho$ conductor which can carry a high current density and a low-$K_e$ dielectric should be utilized in the manufacture of high-performance integrated circuits.

To meet the foregoing criterion, copper interconnect lines within a low-$K_e$ dielectric will likely replace aluminum-alloy lines within a silicon oxide dielectric as the most preferred interconnect structure. See "Copper Goes Mainstream: Low-k to Follow", *Semiconductor International*, November 1997, pp. 67–70. Resistivities of copper films are in the range of 1.7 to 2.0 μΩ cm. while resistivities of aluminum-alloy films are higher in the range of 3.0 to 3.5 μΩ cm.

Despite the advantageous properties of copper, several problems must be addressed for copper interconnects to become viable in large-scale manufacturing processes.

Diffusion of copper is one such problem. Under the influence of an electric field, and at only moderately elevated temperatures, copper moves rapidly through silicon oxide. It is believed that copper also moves rapidly through low-$K_e$ dielectrics. Such copper diffusion causes failure of devices formed within the silicon.

Another problem is the propensity of copper to oxidize rapidly when immersed in aqueous solutions or when exposed to an oxygen-containing atmosphere. Oxidized surfaces of the copper are rendered non-conductive and thereby limit the current carrying capability of a given conductor path when compared to a similarly dimensioned non-oxidized copper path.

A still further problem with using copper in integrated circuits is that it is difficult to use copper in a multi-layer, integrated circuit structure with dielectric materials. Using traditional methods of copper deposition, copper adheres only weakly to dielectric materials.

Finally, because copper does not form volatile halide compounds, direct plasma etching of copper cannot be employed in fine-line patterning of copper. As such, copper is difficult to use in the increasingly small geometries required for advanced integrated circuit devices.

The semiconductor industry has addressed some of the foregoing problems and has adopted a generally standard interconnect architecture for copper interconnects. To this end, the industry has found that fine-line patterning of copper can be accomplished by etching trenches and vias in a dielectric, filling the trenches and vias with a deposition of copper, and removing copper from above the top surface of the dielectric by chemical-mechanical polishing (CMP). An interconnect architecture called dual damascene can be employed to implement such an architecture and thereby form copper lines within a dielectric. FIG. 1 illustrates the process steps generally required for implementing the dual damascene architecture.

Deposition of thin, uniform barrier and seed layers into high aspect ratio (depth/diameter) vias and high aspect ratio (depth/width) trenches is difficult. The upper portions of such trenches and vias tend to pinch-off before the respective trench and/or via is completely filled or layered with the desired material.

Electrodeposition of the copper metallization has been found to be the most efficient way to deposit copper into the trenches and vias. This method has been found to impart the best electromigration resistance performance to the resulting interconnect. However, this method of depositing the copper is not without problems of its own. For example, acid copper plating solutions for copper interconnect often contain organic additives to provide improved throwing power, enhanced leveling effect, and proper deposit characteristics. Since these additives play a significant role in copper plating, the concentrations of these additives in the plating bath need to be tightly controlled to ensure consistent trench fill and film properties. The present inventors have recognized that it would be desirable to use an additive-free plating solution to improve bath control, thereby eliminate the need to monitor the concentrations of the additives. Further, they have recognized that, even in the presence of such additives, certain plating parameters must be optimized.

BRIEF SUMMARY OF THE INVENTION

The present inventors have found that application of metallization, particularly copper metallization, using low current density plating waveforms provides better trench and via filling results when compared to high current density plating waveforms. This is particularly true when additive-free plating solutions are used. However, such low current density plating waveforms are often quite slow in producing metal films of the requisite thickness. Accordingly, a low current density plating waveform is used during initial plating operations while a high current density plating waveform is used to decrease the fill time and, if desired, provide a different film morphology, some time after the initial plating operations are complete.

In accordance with one embodiment of the present invention, the waveshape and its frequency are used to influence the surface morphology of the copper metallization deposit. Further, high metal concentrations in the additive-free plating solutions are used to provide more effective filling of the trench and via structures.

With respect to plating solutions that include additives, the present inventors have found that the plating process may be optimized by employing low metal concentration plating solutions. Such solutions produce higher quality filling of the trenches and vias when compared with copper metallization deposited using solutions having high metal concentrations.

Methods for depositing a metal into a micro-recessed structure in the surface of a microelectronic workpiece are disclosed. The methods are suitable for use in connection with additive free as well as additive containing electroplating solutions. In accordance with one embodiment, the method includes making contact between the surface of the microelectronic workpiece and an electroplating solution in an electroplating cell that includes a cathode formed by the surface of the microelectronic workpiece and an anode disposed in electrical contact with the electroplating solution. Next, an initial film of the metal is deposited into the micro-recessed structure using at least a first electroplating waveform having a first current density. The first current density of the first electroplating waveform is provide to enhance the deposition of the metal at a bottom of the micro-recessed structure. After the this initial plating, deposition of the metal is continued using at least a second electroplating waveform having a second current density. The second current density of the second electroplating waveform is provided to assist in reducing the time required to substantially complete filling of the micro-recessed structure.

DETAILED DESCRIPTION OF THE INVENTION

The present invention can be understood with reference to the experiments disclosed herein. Although the experiments were performed in connection with the plating of a metal comprising copper, it will be recognized that the teachings disclosed herein are so applicable to the electroplating of other metals. All the experiments were performed on 200 mm wafers using a plating tool, such as a plating tool available from Semitool, Inc., of Kalispell, Mont. Three plating baths were examined. The first one, bath 1 (either 24 g/L or 36 g/L copper) had no organic additives. The bath 2

(Additive A) and the bath 2 (Additive B) contain organic additives from different vendors.

Figure 1:
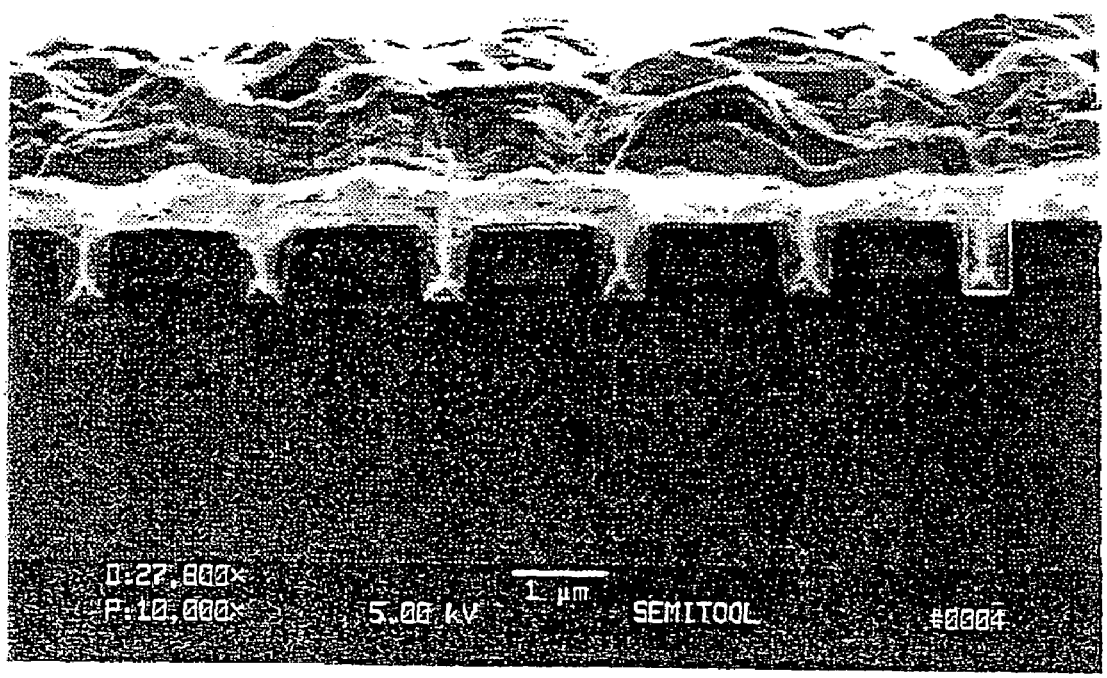
FIG. 1 is a scanning electron microscope ("SEM") photograph showing a cross-section of a metallization layer plated exterior to a semiconductor substrate wherein the metallization layer was deposited using a plating bath without organic additives and using a low-current plating waveform.
Figure 2:
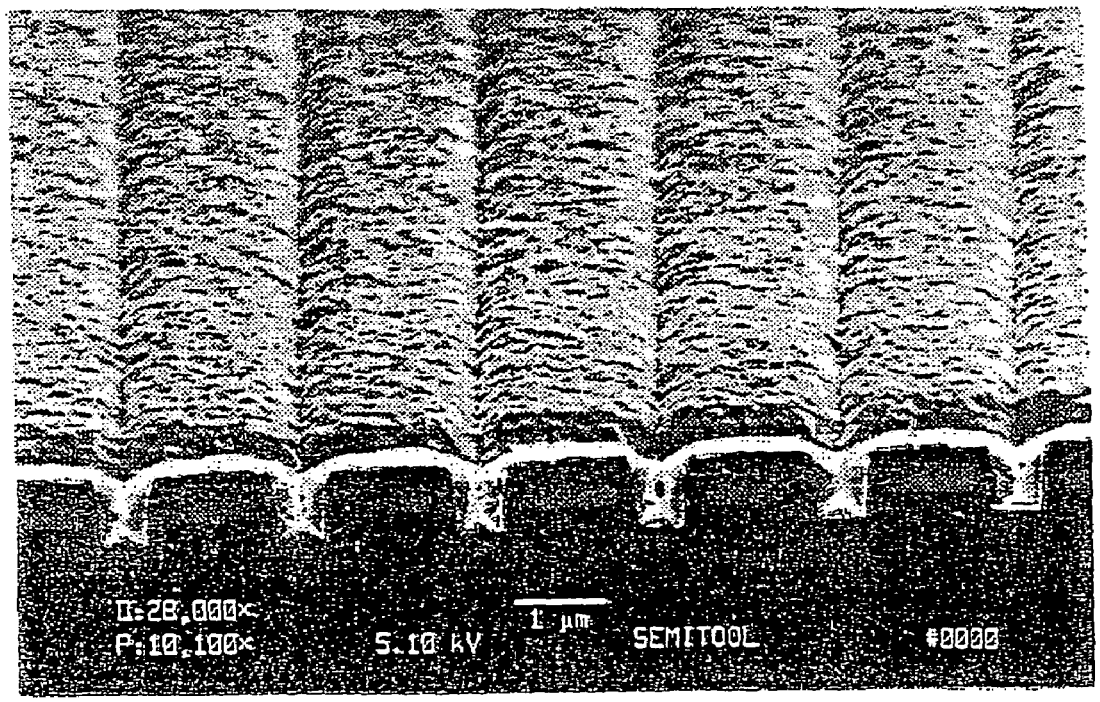
FIG. 2 is a SEM photograph showing a cross-section of a metallization layer plated exterior to a semiconductor substrate wherein the metallization layer was deposited using a plating bath without organic additives and using a high current density plating waveform.

Good trench fill was obtained at low current density of 4 mA/cm$^2$ for copper concentrations from 15 to 36 g/L. It is believed that the high micro-throwing power at low current density due to low concentration polarization is responsible for such trench fill at high copper concentrations. FIG. 1 presents a scanning electron microscope ("SEM") cross-section obtained from bath 1 with 24 g/L copper. Void-free fill was obtained for 0.5μ wide, 2:1 aspect ratio trench. The waveshape used was a forward pulse with 1 ms on and 1 ms off (WF1). It was found that the waveshape was not significant for fill as long as the current density was low. As seen from FIG. 1, rough surface or large grains were observed with 4 mA/cm$^2$, implying that grain growth was the principal mechanism for the deposition as opposed to the formation of new nuclei. The copper deposit becomes smoother with high current density (40 mA/cm$^2$) as shown in FIG. 2. However, the fill at this higher current is not as good and seam voids were seen in the trench.

In view of the characteristics of the low current density and high current density waveforms, the present inventors have found that such waveforms can be combined during a single electroplating process whereby the advantages associated with each waveform are exploited to provide a sub-micron electroplating process that meets the process characteristics (void filling and time for filling) required to make it commercially viable. To this end, an electroplating waveform having low current density is used during the initial phases of the trench and/or via filling stage of the process. At some time subsequent to such initial filling, the electroplating waveform transitions to a higher current density waveform to complete the electroplating process and reduce the total time required for the process.

Figure 3A:
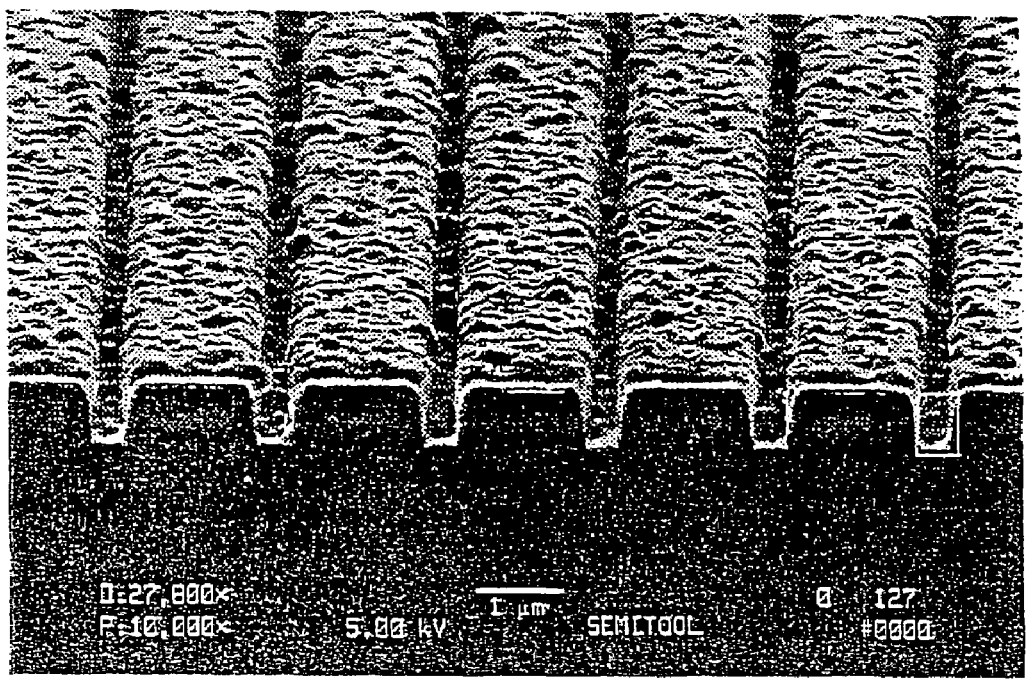
FIGS. 3(a)–(d) are SEM photographs showing cross-sections of metallization layers plated exterior to respective semiconductor substrates wherein the metallization layers were deposited using incremental depositions at different current densities and thicknesses.
Figure 3B:
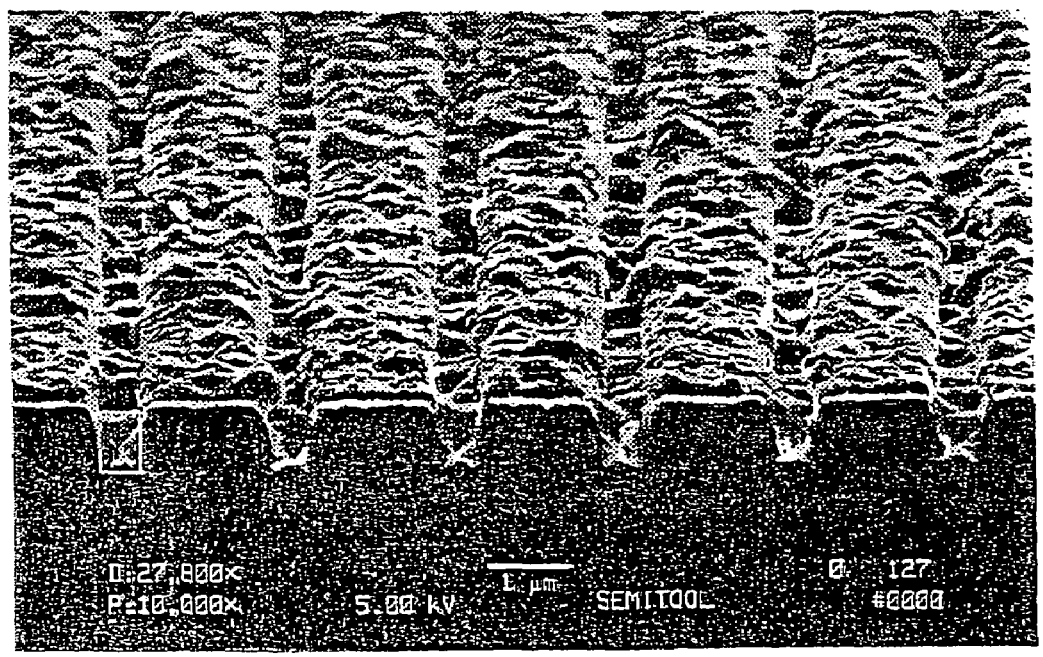
Figure 3C:
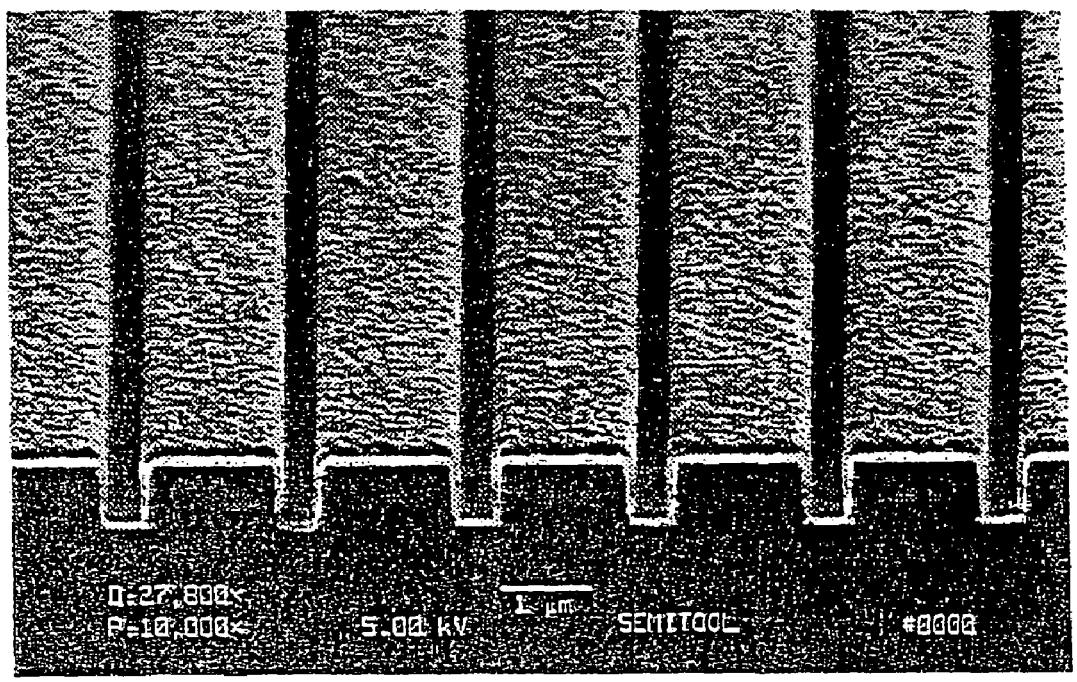
Figure 3D:
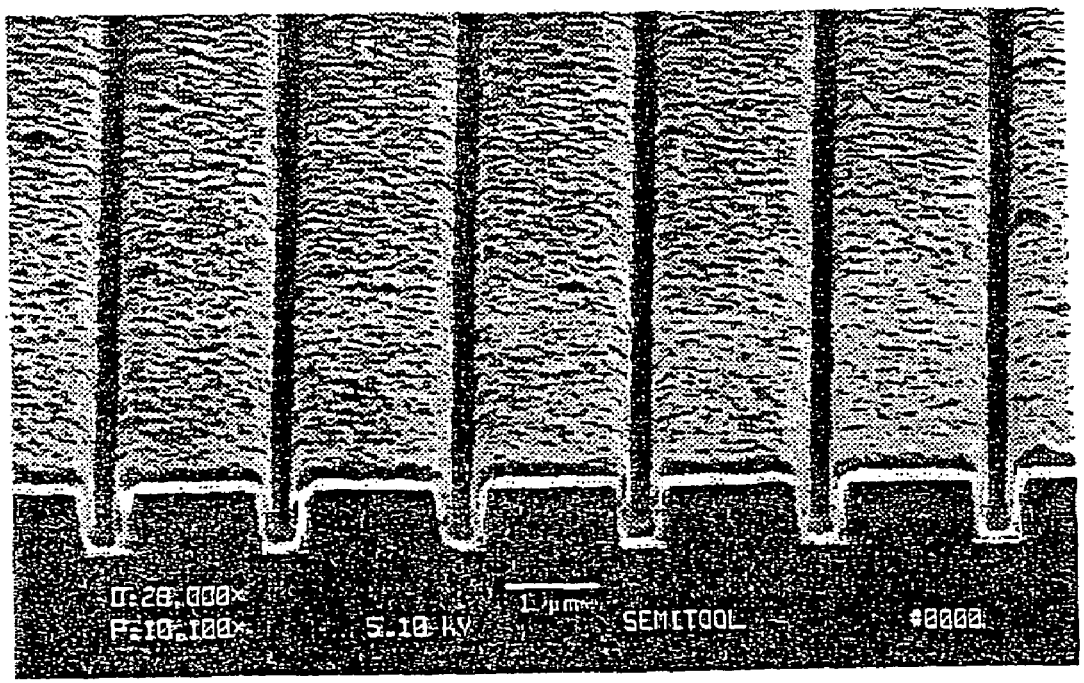

To understand how the copper was deposited inside trench and via features, incremental deposition at different current densities and thicknesses, represented as Ampere-minutes (A-min), was conducted. The results are compared in FIGS. 3(a)–(d). At low current density, large grains were seen (FIGS. 3(a) and (b)). As the thickness increased from 1.26 to 3.78 A-min, enhanced growth at the bottom of the trench is achieved, probably explaining why good fill was obtained in FIG. 1 at low current density. As such, the low-current density value should be chosen to provide enhanced growth of the copper metallization layer at the lower portions of the feature into which the copper metallization is deposited. At high current density (40 mA/cm$^2$, FIGS. 3(c) and (d)), the deposit is smooth and very conformal. Compared to FIG. 2, where seam voids are observed, conformal plating is not sufficient to guarantee void-free fill because the top part of the trench is often pinched off first leaving voids inside.

Figure 4:
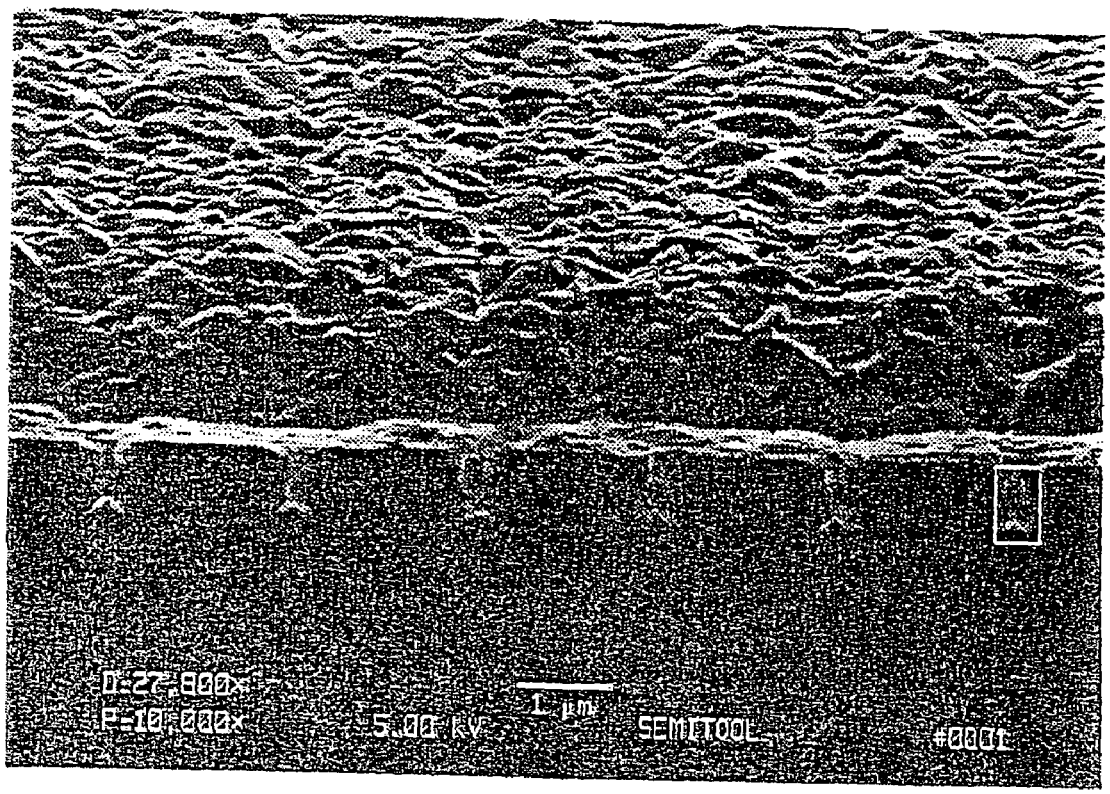
FIG. 4 is a SEM photograph showing a cross-section of a metallization layer plated exterior to a semiconductor substrate wherein the metallization layer was deposited using a pulse reverse waveform.

It is believed that the seam voids illustrated in these Figures resulted from the overplating of copper deposit at the top of the feature due to its high current distribution. It is expected that the overplated copper will be preferentially removed if a reverse pulse is included in the waveshape. However, the addition of reverse pulses did not improve the trench fill as shown in FIG. 4 where seam voids were still observed even with a pulse reverse waveshape.

Therefore, an initial low current density approach is necessary for gap fill if no-additive bath is used. In addition to good trench fill, initial low current is helpful to improve the contact to the seed layer, particularly when the seed layer is very thin. However, the drawback of low current is its long processing time. To circumvent this, a plating recipe with multiple steps is preferred in which a low current plating waveform is used to fill the small feature and, possibly, to enhance the seed layer, and then a high current plating waveform is used to finish the process and to provide smooth surface for one or more subsequent CMP processes.

Figure 5:
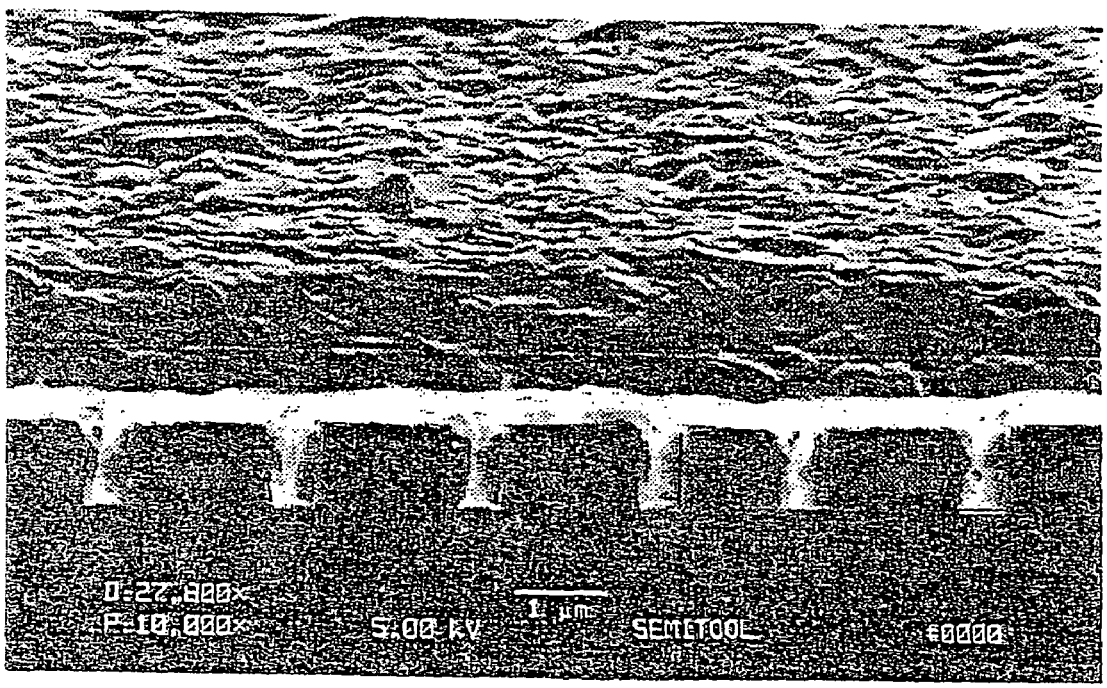
FIG. 5 is a SEM photograph showing a cross-section of a metallization layer plated exterior to a semiconductor substrate wherein the metallization layer was deposited using a two-step waveform comprised of an initial waveform having a low-current density followed by a further waveform having high-current density.
Figure 6:
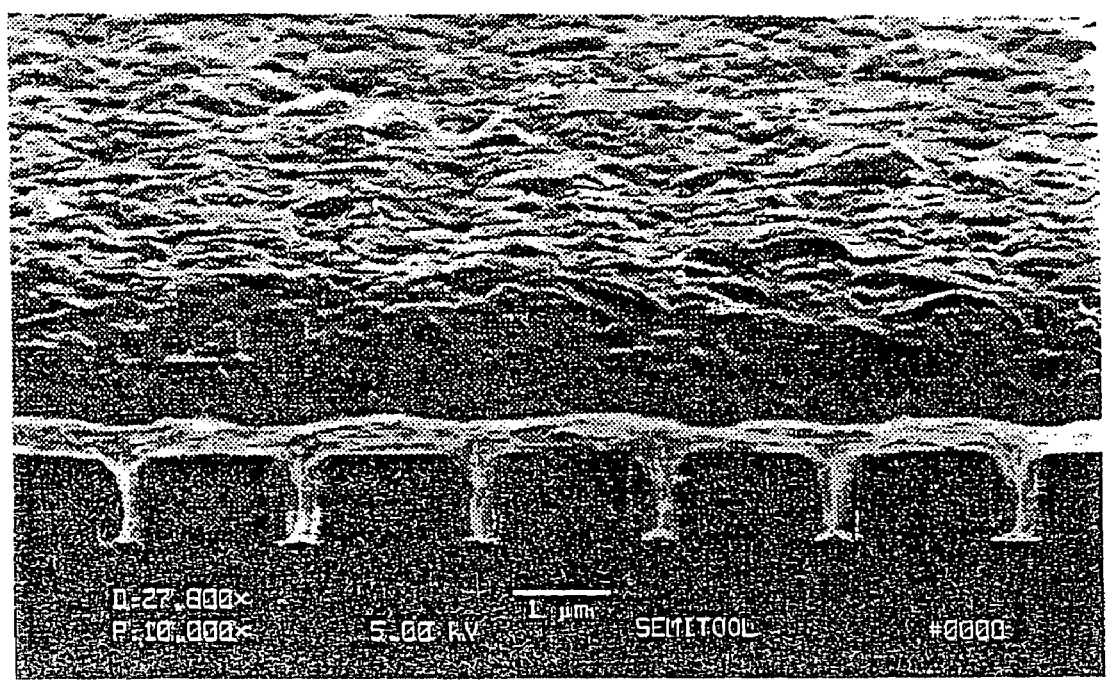
FIG. 6 is a SEM photograph showing a cross-section of a metallization layer plated exterior to a semiconductor substrate wherein the metallization layer was plated using the two-step waveform used to plate the metallization layer of FIG. 5, but wherein plating solution had a high copper concentration.

FIG. 5 shows a cross-section obtained with a two-step waveform of 4 mA/cm$^2$ followed by 32 mA/cm$^2$. An improvement in gap fill was observed. Using the same two-step waveform, an increase in the copper concentration (36 g/L) provided significant improvement of the fill process as illustrated in FIG. 6.

Figure 7:
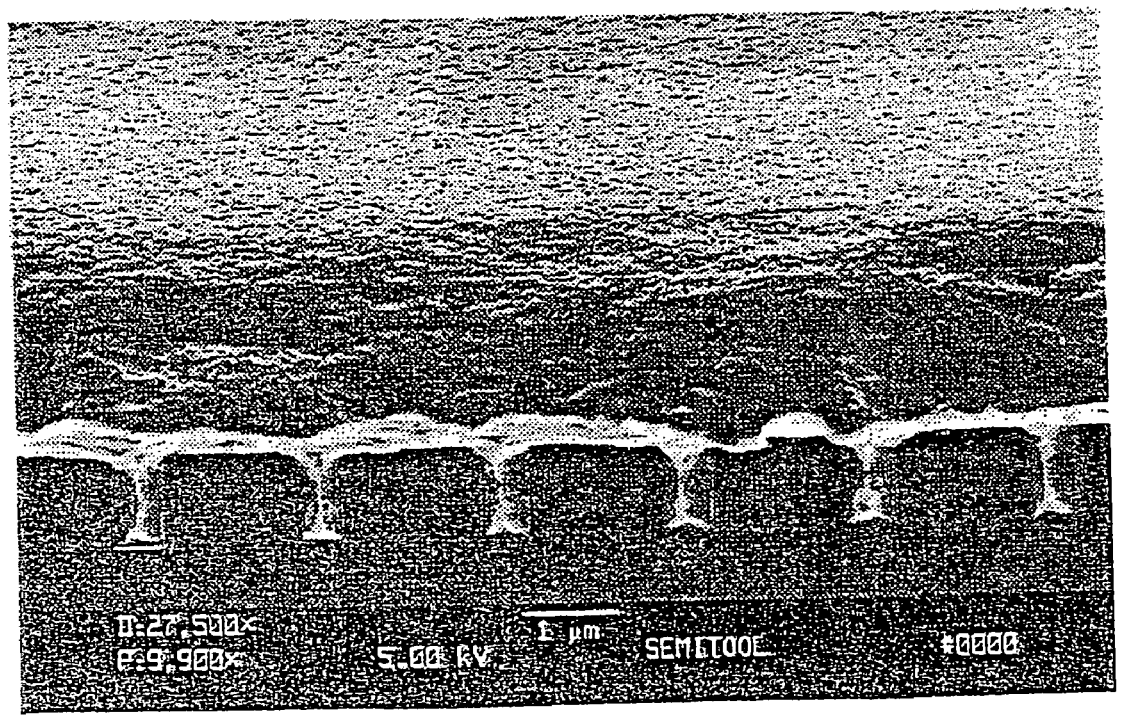
FIGS. 7 and 8 are SEM photographs showing cross-sections of metallization layers plated exterior to respective semiconductor substrates wherein the layers were deposited using a one-step waveform in a plating bath having organic additives.
Figure 8:
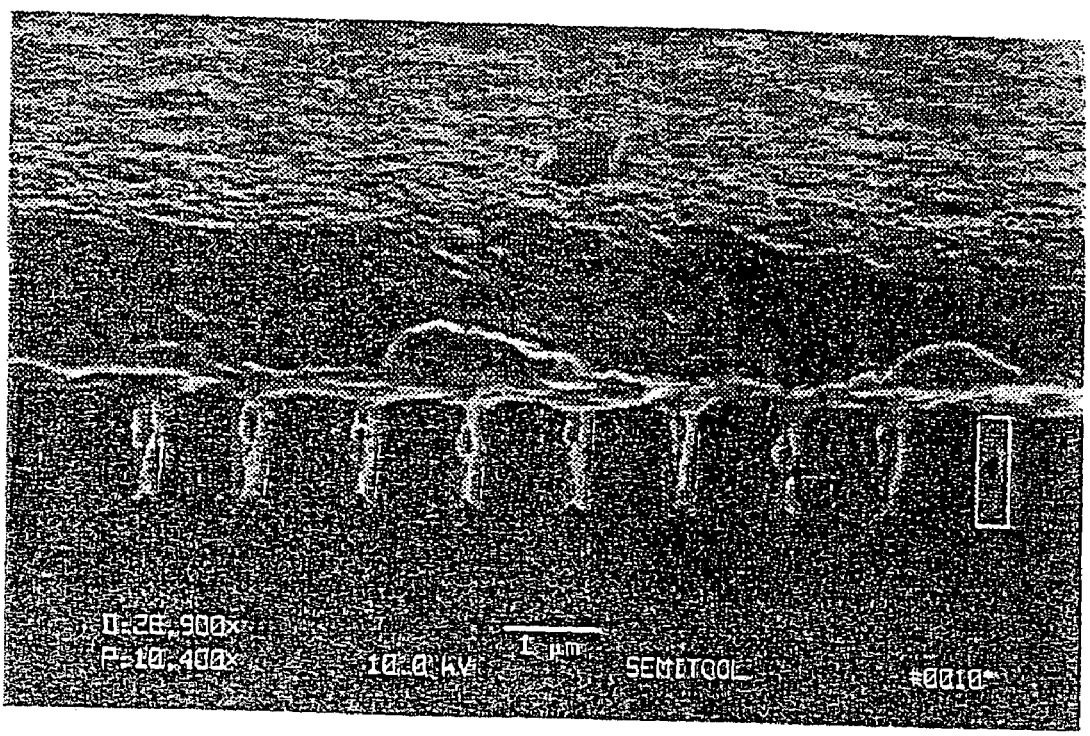
Figure 9:
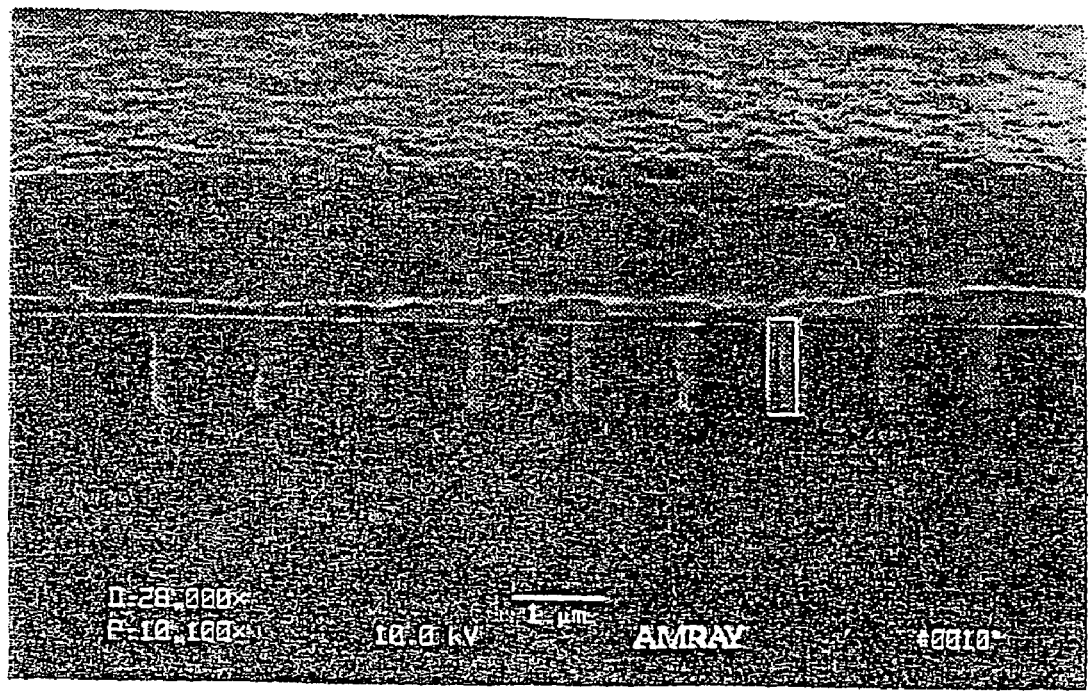
FIG. 9 is a SEM photograph showing a cross-section of a metallization layer plated exterior to a semiconductor substrate wherein the metallization layer was plated using the one-step waveform used in the metallization process of FIGS. 7 and 8, but wherein the copper concentration of the plating solution has been reduced.

The effect of copper concentration on the gap fill for acidic baths with additives was examined using bath 2 disclosed above. FIG. 7 illustrates a metallization way are plated from such a bath using a 1-step waveform at 20 mA/cm$^2$. FIG. 8 is a cross-section obtained at 20 mA/cm$^2$ with 20 g/L copper in the solution. Although the surface of the deposit was smooth, similar to bath 3, voids were observed in the trench at this copper concentration. As the copper concentration decreased from 20 to 10 g/L, void-free fill was obtained as in FIG. 9. The better gap fill at lower copper concentration in the presence of organic additives is different from that obtained for additive-free bath in which high copper provided better gap fill. This implies a different controlling mechanism for copper growth in the presence of additives. Similar to those obtained from additive-free bath, pulse reverse was found to produce voids and rough surface in this bath with additives.

Figure 10A:
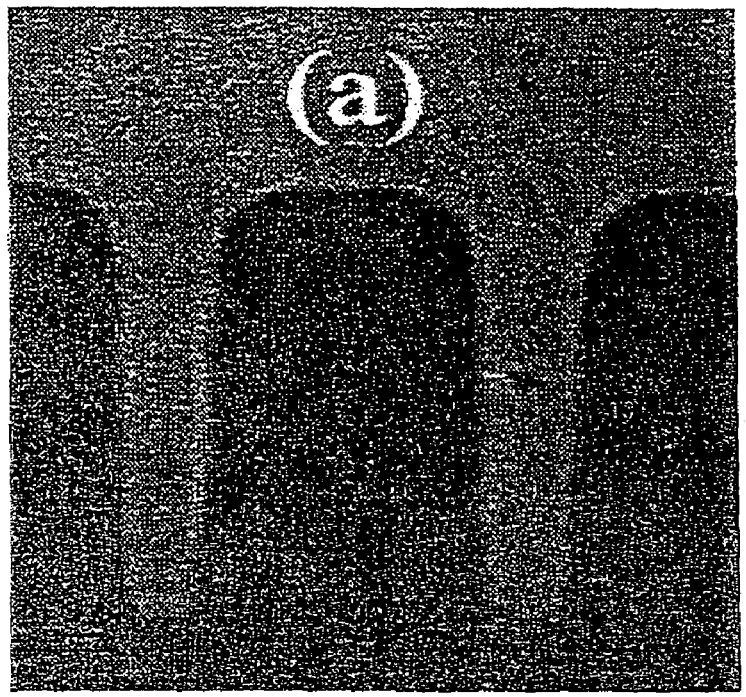
FIGS. 10(a)–10(c) are FIB photographs showing cross-sections of metallization layers plated exterior to respective semiconductor substrates wherein the metallization layers were plated using a plating bath having organic additives, and wherein the photographs illustrate the effect of seed layer quality on the plating process.
Figure 10B:
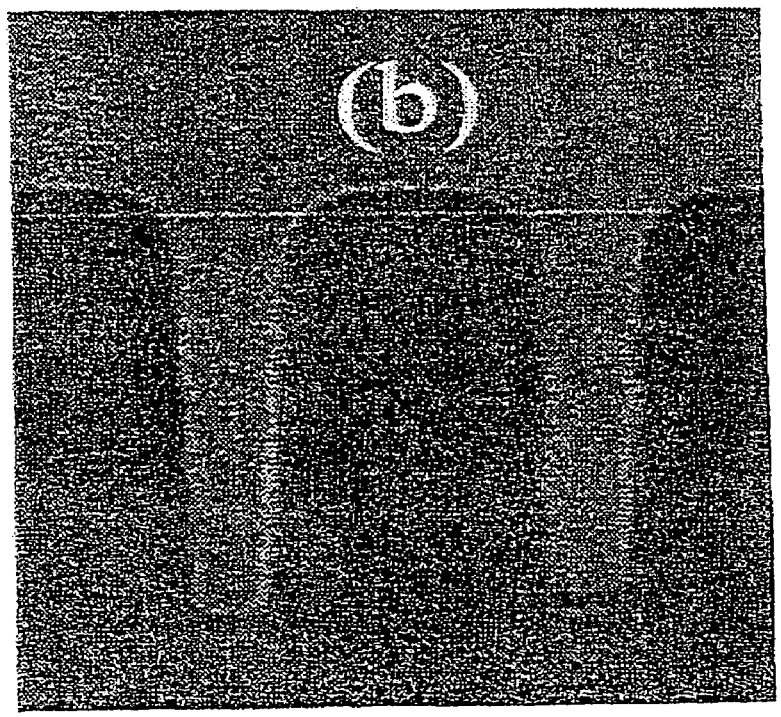
Figure 10C:
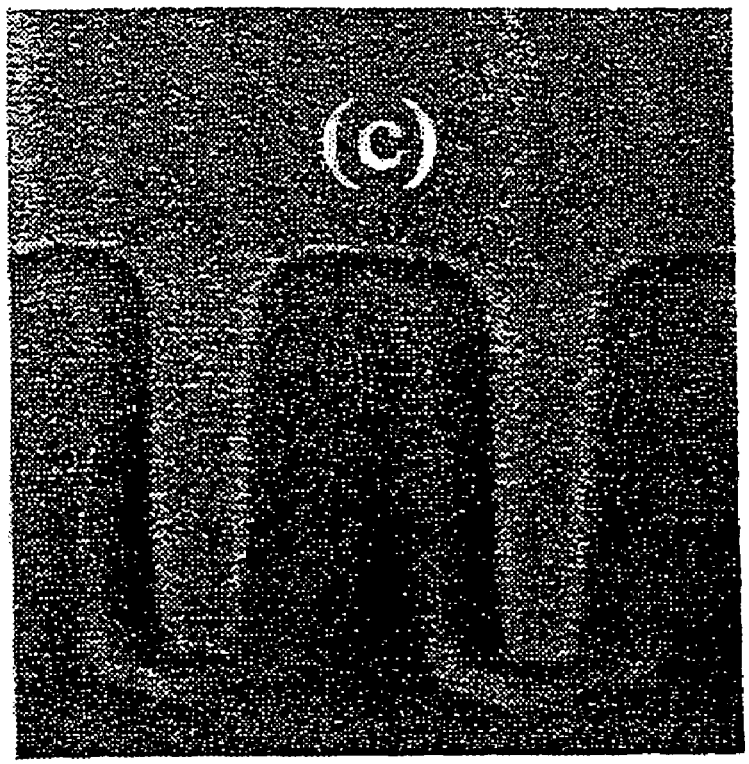

FIGS. 10(a)–(c) illustrates the effect of seed layer on the gap fill. The center voids (FIG. 10a) are formed when the top of the feature is pinched off before the filling is completed. The overhanging of the seed layer at the top of the feature, due to the line-of-sight deposition inherent in the PVD process, is often the main reason for the center voids and the insufficient suppressor of copper growth at the top of the trench during the plating is the other one. The former needs the optimization of the PVD process to deposit a conformal layer and may possibly require a combination of PVD process and other techniques such as CVD or electrochemical deposition for small features. The latter calls for the optimization of the plating process by changing the bath composition and plating waveform.

The bottom and sidewall voids (FIG. 10(b)) are mainly attributed to the insufficient coverage of the seed layer. Copper oxide is always formed on the seed layer prior to the plating when the wafer is exposed to air. This oxide is readily removed, and the underlying copper can be chemically etched when the wafer is in contact with the acidic plating solution. This may lead to the exposure of the barrier layer to the solution and result in the formation of bottom or sidewall voids. There are ways to eliminate these voids either by having a thick layer in the feature or using less aggressive plating solutions for the copper plating. By optimizing the seed layer, void-free gap fill was achieved as in FIG. 10(c).

Numerous modifications may be made to the foregoing processes without departing from the basic teachings thereof. Although the present invention has been described in substantial detail with reference to one or more specific process embodiments, those of skill in the art will recognize that changes may be made thereto without departing from the scope and spirit of the invention.

We claim:

1. A method for depositing a metal into a micro-recessed structure in the surface of a microelectronic workpiece, the method comprising:

contacting the surface of the microelectronic workpiece with an electroplating solution in an electroplating cell, the electroplating cell including a cathode formed by the surface of the microelectronic workpiece and an anode;

electroplating to deposit a metal into the micro-recessed structure by applying a first electroplating waveform having a first current to the anode to enhance deposition of the metal at a bottom of the micro-recessed structure; and further electroplating to further deposit the metal by changing the waveform applied to the anode to a second electroplating waveform having a second current to change the time required to at least substantially fill of the micro-recessed structure, wherein the second current is greater than the first current.

2. A method as claimed in claim 1 wherein the electroplating solution is substantially free of organic additives and has a high concentration of the metal that is to be electroplated.

3. A method as claimed in claim 1 wherein the metal that is to be plated is comprised of copper.

4. A method as claimed in claim 1 wherein the ratio between the first current density and the second current density is about 1:10.

5. A method as claimed in claim 1 wherein the ratio between the first current density and the second current density is about 1:8.

6. A method for depositing a metal into a micro-recessed structure in the surface of a microelectronic workpiece, the method comprising:

contacting the surface of the microelectronic workpiece with an electroplating solution in an electroplating cell, the electroplating cell including a cathode formed by the surface of the microelectronic workpiece and an anode;

depositing metal into the micro-recessed structure by applying a first electroplating waveform having a first current to the anode to enhance deposition of the metal in a bottom of the micro-recessed structure;

continuing to deposit the metal into the micro-recessed structure by applying a second electroplating waveform having a second current to the anode, the second current of the second electroplating waveform being different than the first current of the first electroplating waveform, wherein the second current is greater than the first current.

7. A method as claimed in claim 6 wherein the electroplating solution has a high concentration of metal ions or complexes of the metal that is to be deposited in the micro-recessed structure.

8. A method as claimed in claim 7 wherein the electroplating solution is substantially free of organic additives that are typically used as levelers or brighteners.

9. A method as claimed in 6 wherein the metal that is to be plated is comprised of copper.

10. A method as claimed in claim 7 wherein the metal that is to be plated is comprised of copper.

11. A method as claimed in claim 8 wherein the metal that is to be plated is comprised of copper.

12. A method as claimed in claim 7 wherein the electroplating solution comprises a concentration of the metal that is between about 15 g/L and 36 g/L.

13. A method as claimed in claim 9 wherein the electroplating solution comprises a concentration of copper that is between about 15 g/L and 36 g/L.

14. A method as claimed in claim 10 wherein the electroplating solution comprises a concentration of copper that is between about 15 g/L and 36 g/L.

15. A method as claimed in claim 11 wherein the electroplating solution comprises a concentration of copper that is between about 15 g/L and 36 g/L.

16. A method as claimed in claim 6 wherein the ratio between the first current density and the second current density is about 1:10.

17. A method as claimed in claim 6 wherein the ratio between the first current density and the second current density is about 1:8.

18. A method as claimed in claim 7 wherein the ratio between the first current density and the second current density is about 1:10.

19. A method as claimed in claim 7 wherein the ratio between the first current density and the second current density is about 1:8.

20. A method as claimed in claim 8 wherein the ratio between the first current density and the second current density is about 1:10.

21. A method as claimed in claim 8 wherein the ratio between the first current density and the second current density is about 1:8.

22. A method as claimed in claim 9 wherein the ratio between the first current density and the second current density is about 1:10.

23. A method as claimed in claim 9 wherein the ratio between the first current density and the second current density is about 1:8.

24. A method as claimed in claim 10 wherein the ratio between the first current density and the second current density is about 1:10.

25. A method as claimed in claim 10 wherein the ratio between the first current density and the second current density is about 1:8.

26. A method as claimed in claim 11 wherein the ratio between the first current density and the second current density is about 1:10.

27. A method as claimed in claim 11 wherein the ratio between the first current density and the second current density is about 1:8.

28. A method as claimed in claim 6 wherein the first electroplating waveform is a pulsed waveform.

29. A method as claimed in claim 7 wherein the first electroplating waveform is a pulsed waveform.

* * * * *